US011804657B2

(12) United States Patent
Thakur et al.

(10) Patent No.: US 11,804,657 B2
(45) Date of Patent: Oct. 31, 2023

(54) CHASSIS FOR AN ELECTRONIC DEVICE, ELECTRONIC DEVICE, ANTENNA MODULE, AND METHOD FOR FABRICATING AN ELECTRONIC DEVICE

(71) Applicant: Intel Corporation, Santa Clara, CA (US)

(72) Inventors: Jayprakash Thakur, Bangalore (IN); Maruti Tamrakar, Chennai (IN); Sagar Gupta, Ghaziabad (IN); Harry G. Skinner, Beaverton, OR (US); Prakash Kurma Raju, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 17/448,746

(22) Filed: Sep. 24, 2021

(65) Prior Publication Data

US 2022/0200154 A1    Jun. 23, 2022

(30) Foreign Application Priority Data

Dec. 23, 2020  (EP) ..................... 20216793

(51) Int. Cl.
 *H01Q 13/10* (2006.01)
 *H05K 1/02* (2006.01)
(52) U.S. Cl.
 CPC .......... *H01Q 13/10* (2013.01); *H05K 1/0237* (2013.01); *H05K 1/0277* (2013.01)

(58) Field of Classification Search
 CPC .... H01Q 13/10; H01Q 1/2266; H01Q 1/2291; H01Q 1/526; H01Q 5/371
 See application file for complete search history.

(56) References Cited

U.S. PATENT DOCUMENTS

| | | | |
|---|---|---|---|
| 2004/0257283 A1 | 12/2004 | Asano et al. | |
| 2014/0184450 A1* | 7/2014 | Koo .................... | H01Q 1/2266 343/702 |
| 2014/0268583 A1* | 9/2014 | Ding .................... | H05K 9/0016 361/728 |
| 2016/0205766 A1* | 7/2016 | Blum .................... | H05K 1/181 174/254 |
| 2017/0309993 A1 | 10/2017 | Tu et al. | |
| 2017/0346164 A1* | 11/2017 | Kim ..................... | H04M 1/0266 |
| 2018/0375189 A1 | 12/2018 | Hawaka et al. | |
| 2020/0099138 A1* | 3/2020 | Garrido Lopez .... | H01Q 9/0407 |
| 2020/0136268 A1* | 4/2020 | Saeidi .................. | H01Q 1/243 |

FOREIGN PATENT DOCUMENTS

EP           2911033 A1 *  8/2015  ........... G06F 1/1656
WO     2013155015 A1    10/2013

* cited by examiner

*Primary Examiner* — Hoang V Nguyen
(74) *Attorney, Agent, or Firm* — 2SPL Patent Attorneys PartG mbB

(57) ABSTRACT

A chassis for an electronic device is provided. The chassis comprises a chassis part made of conducting material. At least one slot antenna is formed in the chassis part made of conducting material.

18 Claims, 22 Drawing Sheets

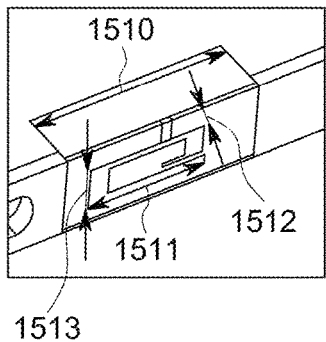 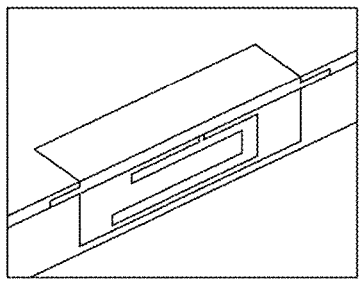 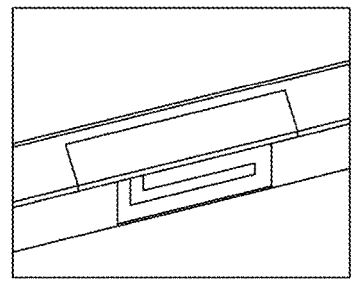
FIG. 15a FIG. 15b FIG. 15c
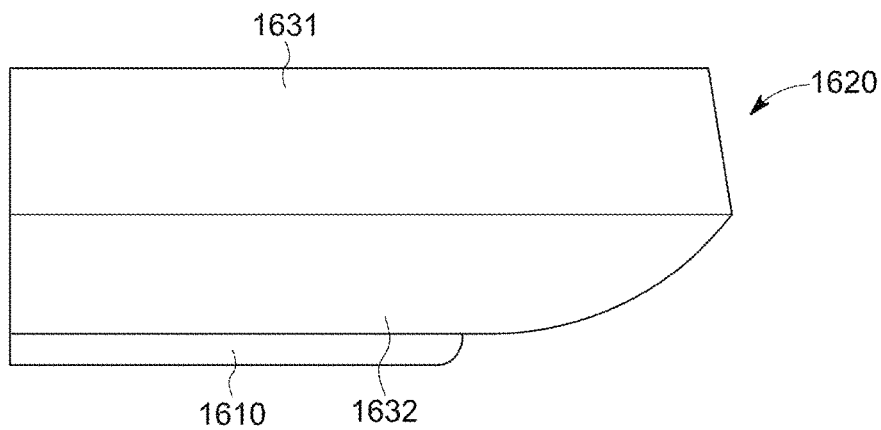
FIG. 16
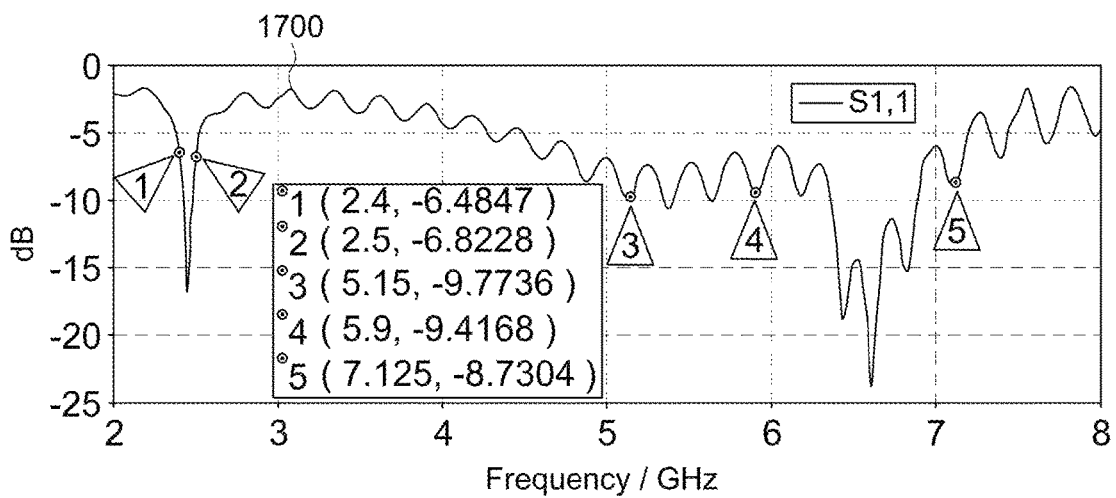
FIG. 17a Theta / deg vs. dBi Phi / deg vs. dBi

CHASSIS FOR AN ELECTRONIC DEVICE, ELECTRONIC DEVICE, ANTENNA MODULE, AND METHOD FOR FABRICATING AN ELECTRONIC DEVICE

CROSS-REFERENCE TO RELATED APPLICATIONS

This application claims priority to European Application 20216793.8, filed on Dec. 23, 2020. The content of this earlier filed application is incorporated by reference herein in its entirety.

FIELD

The present disclosure relates to antenna structures for electronic devices. In particular, examples relate to chassis for an electronic device, electronic devices, mobile devices, antenna modules and methods for fabricating an electronic device.

BACKGROUND

For a laptop, a sufficient connectivity of an antenna may be given especially for one operation mode, namely open lid-mode. On the other hand, the connectivity of the antenna may be insufficient for other operating modes, e.g., for closed lid-mode and/or tent-mode, because radiation emitted by the antenna may be partially shielded in these operation modes. Thus, an improved antenna design and/or placing may be desired.

BRIEF DESCRIPTION OF THE FIGURES

Some examples of apparatuses and/or methods will be described in the following by way of example only, and with reference to the accompanying figures, in which

FIGS. 15*a* to 15*c* show schematic views of different examples of a slot antenna;

FIG. 16 shows a side view of an example of an electronic device;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e., only A, only B as well as A and B. An alternative wording for the same combinations is "at least one of the group A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
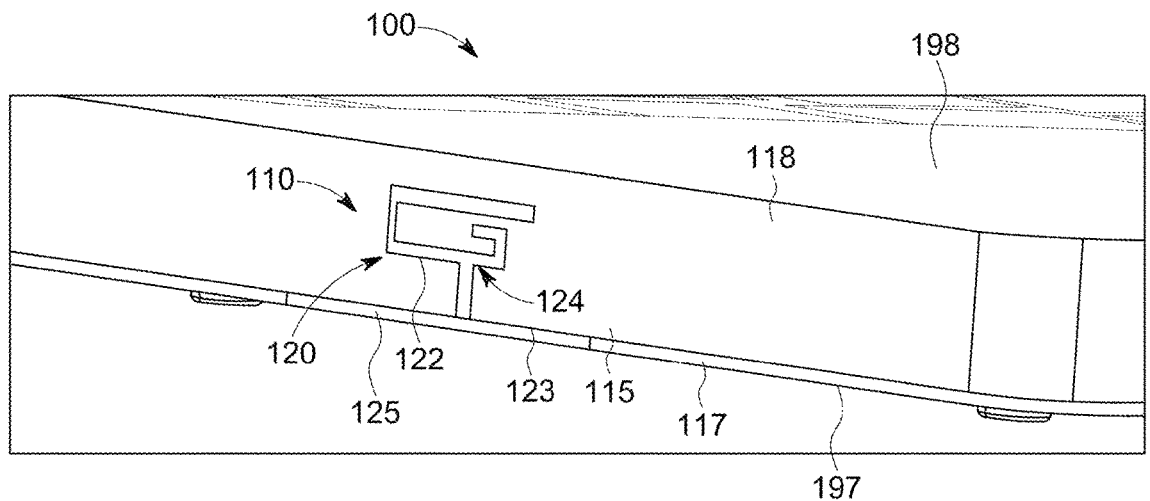
FIG. 1 shows a schematic view of an example of a chassis for an electronic device.

FIG. 1 shows a schematic view of an example of a chassis 100 for an electronic device. The chassis 100 comprises a chassis part 110 made of conducting material. Further, at least one slot antenna 120 is formed in the chassis part 110 made of conducting material.

The integration of an antenna into the electronic device may be facilitated by forming the slot antenna 120 in the conducting chassis part 110. As the slot antenna 120 is integrated into the chassis 100, assembly of the electronic device may be facilitated. Further, the chassis 100 may allow to reduce production costs of the electronic device as no separate antenna device is needed.

The conducting material may, e.g., be a metal, a semiconductor or a conductive polymer. For example, the conducting chassis part 110 may be entirely formed of the conducting material. Alternatively, the conducting chassis part 110 may be formed by a conductive layer on top of a non-conducting chassis part. For example, a non-conducting chassis part may be partially metalized to form the conducting chassis part 110. Thus, the conducting chassis part 110 may be formed by a cheap non-conducting material, e.g., plastic, and only a layer on top may be utilized to form the conducting chassis part 110, which may reduce material cost for the chassis 100.

The at least one slot antenna 120 may be formed on a lateral part 115 of the chassis 100. The lateral part 115 is a part of the chassis 100 that extends between the parts of the chassis 100 defining the bottom and top surfaces of the chassis. By forming the slot antenna 120 in the lateral part 115 the slot antenna 120 may advantageously radiate and/or receive electromagnetic waves substantially without being influenced by other parts of the chassis 100 and/or the electronic device—e.g., independent of an operation mode of the electronic device. Thus, forming the slot antenna 120 in the lateral part 115 of the chassis may allow an improved radiation and/or reception of electromagnetic waves for each operation mode.

The chassis 100 may comprise a first chassis part 117 and a second chassis part 118 connected to each other. The first chassis part 117 may be adapted for placing the chassis 100 on a surface (e.g., defining the bottom of chassis 100) such that the first chassis part 117 may be arranged between the surface and the second chassis part 118, and the at least one slot antenna 120 may be formed in the second chassis part 118. For example, the first chassis 117 part may define the bottom of the chassis 100, e.g., a bottom surface, and/or the second chassis part 118 may define the top surface 198 of the chassis 100. The top surface 198 and the bottom surface 197 may be parallel to each other. The lateral part 115 may belong to the first chassis part 117 (e.g., defining the bottom surface 197 of the chassis 100) or the second chassis part 118 (e.g., defining the top surface 198 of the chassis 100). A height of the lateral part 115 may define a distance between the bottom surface 197 and the top surface. A keyboard and/or touchpad may be integrated in the top surface 198 of the second chassis part 118. A footer may be integrated in the bottom surface 197 of the first chassis part 117.

By arranging the slot antenna 120 in the second chassis part 118 a distance to the surface, on which the first chassis part 117 may be placed, may be increased. Thus, an attenuation of electromagnetic waves radiated by the slot antenna 120 may advantageously be decreased due to the increased distance between the slot antenna 120 and the surface. The slot antenna 120 may be arranged in the lateral part 115 of the second chassis part 118 and/or in the top surface.

The at least one slot antenna 120 may be formed by an opening 122 in the chassis part 110 made of conducting material. The opening 122 may be formed by removing a part of the conducting chassis part 110, e.g., by laser cutting or mechanical cutting. It is to be noted that the shape of the opening 122 for forming the at least one slot antenna 120 is merely exemplary. In general, any suitable shape may be used for the opening 122.

The opening 122 may be filled with non-conducting material 124. The non-conducting material 124 may be e.g., a polymer (e.g., polyphenylene sulfide or polybutylene terephthalate). The non-conducting material 124 may be formed by plastic injection insert molding. Thus, the opening 122 may be closed by the non-conducting material 124, which may improve an external appearance of the chassis 100. Further, intrusion of foreign material into the chassis 100 may be avoided such that the circuitry and devices inside the chassis 100 may be protected from the foreign material.

The non-conducting material 124 to fill the opening 122 may have a base 125. The base 125 may be configured to improve an arrangement of the non-conducting material 124. Further, the base 125 may be arranged in a second opening 123 in the chassis 100. The second opening 123 may be in the first chassis part 117, e.g., in the bottom surface 197. Thus, the second opening 123 may improve an arrangement and/or stability of the non-conducting material. Further, the second opening 123 may provide a wider impedance bandwidth of the slot antenna 120. For example, the second opening 123 in the chassis may be adjusted to improve a radiation performance of the slot antenna 120.

The chassis 100 may be entirely made of conducting material. Thus, a manufacturing process of the chassis 100 may be facilitated, because the chassis 100 may be manufactured only by forming and removing processes, e.g., by use of a computerized numerical control machine.

Alternatively, the chassis 100 may be made of a non-conducting material, e.g., a polymer, except of the conducting part 110. Thus, a material cost for the chassis 100 may be reduced.

The chassis 100 may further comprise a second slot antenna (not illustrated in FIG. 1) formed in the chassis part 110 made of conducting material or formed in another chassis part made of conducting material. The second slot antenna may be arranged at another lateral part of the chassis 100 opposite to the at least one slot antenna 120 (e.g., similar to what is illustrated in FIG. 14). For example, the slot antenna 120 and the second antenna may be arranged on opposite edges (e.g., sides of the electronic device; e.g., the lateral part) of the electronic device. Radiation and/or reception of electromagnetic waves by the electronic device may be improved because both antennas may cover different areas of the space surrounding the electronic device.

FIG. 1 shows an example of antenna construction in an edge of an electronic device, e.g., a full metal chassis laptop. A proximity feed antenna concept may be applied for feeding the slot antenna 120. A (compact) slot pattern is shown in the FIG. 1. The slot antenna 120 may be proximity coupled by a metal strip. The metal strip may be placed behind the slot antenna 120. A coaxial cable may be soldered to the metal strip and connected to a radio-frequency-module (RF-module).

The proposed slot antenna 120 may be made in an edge of the chassis 100, e.g., in the second chassis part 120 (also referred to as C-cover, with a Z-height (see FIG. 4)). The C-cover may be adapted as a housing for a system assembly. The system assembly may comprise assembling a keyboard (e.g., into the second chassis part 118) and/or other parts of the electronic device such as a motherboard. An Antenna pattern in an edge of the C-cover may be made by creating openings (e.g., the opening 122) in the edge. These openings may further be filled by any non-conducting (e.g., plastic) martial. For example, slots of the opening 122 may have a width of at most 1.5 mm, or at most 1.3 mm or at most 1.1 mm, or at most 1 mm. The (slot) opening 122 may be identified easily in the chassis 100, thus the slot antenna pattern may help to generate a seamless industrial design.

As shown in the FIG. 1, a top of the C-cover may have no cutouts for the antenna. This may give a seamless look to the system, e.g., the chassis 100, as well as it may improve a performance when a lid of the chassis 100 may closed. Also shown in FIG. 1 is the opening 122 (e.g., in the C-cover) and the second opening 123 (e.g., in the first chassis part 117, also referred to as D-cover). Both openings 122, 123 may be a part of an antenna pattern, e.g., for forming the slot antenna 120.

More details and aspects are mentioned in connection with the examples described below. The example shown in FIG. 1 may comprise one or more optional additional features corresponding to one or more aspects mentioned in connection with the proposed concept or one or more examples described below (e.g., FIG. 2-20).

Figure 2:
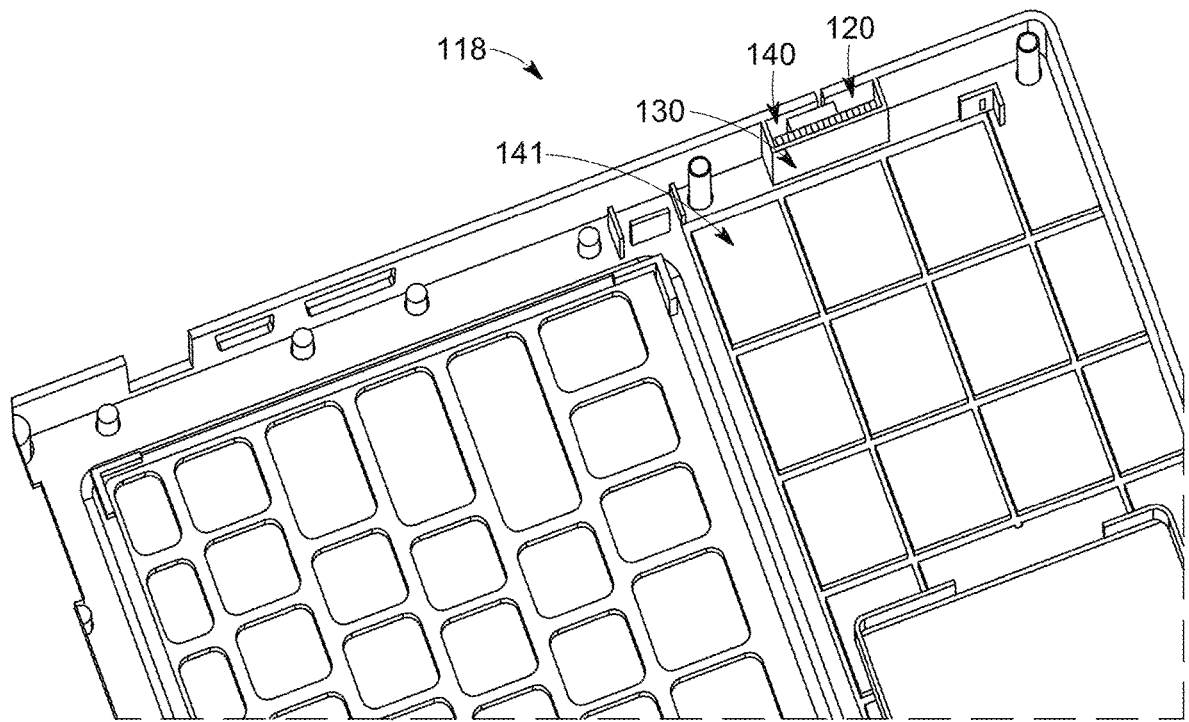
FIG. 2 shows a schematic view of an example of a second part of a chassis.

FIG. 2 shows a schematic view of an example of a second part of a chassis. The second chassis part 118 may further comprise a radiation shielding 130 configured to electromagnetically shield the slot antenna 120 from an interior of the chassis 100. Thus, an excitation/operation of the slot antenna 120 may be improved, e.g., by reducing coupling of electromagnetic signals (e.g., generated by electronic circuitries) arranged inside the chassis 100. The radiation shielding 130 may be formed by, e.g., metal.

The chassis 100 may further comprise at least one conducting gasket (see, e.g., FIG. 13) arranged between the radiation shielding 130 and another part of the chassis 100. The chassis 100 may further comprise two conducting gaskets (see, e.g., FIG. 13) arranged between the radiation shielding 130 and a respective other part of the chassis 100. One conducting may by in contact with the first chassis part 117 and another conducting gasket may be in contact with the second chassis part 118. The two conducting gaskets may be arranged at opposite sides of the radiation shielding 130. A conducting gasket may improve a connection between the radiation shielding 130 and the chassis 100 (e.g., the first chassis part 117 and the second chassis part 118), which may increase an effect of the radiation shielding 130. For example, the radiation shielding 130 arranged between two conducting gaskets may shield almost all radiation and thus electromagnetically shield one space 140 in the chassis 100 on a first side of the radiation shielding 130 from another space 141 in the chassis 100 on a second side of the radiation shielding 130. Thus, a slot antenna 120 arranged in one space 140 may be improved electromagnetically shielded against electronic circuitries arranged in the other space 141.

FIG. 2 shows an example of a radiation shielding 130, e.g., a barricade (e.g., the barricade may be made of metal), arranged next to the antenna (pattern) 120. The barricade may electromagnetically shield the slot antenna 120 from the other electronic circuitries of the electronic device arranged in the other space 141. Thus, a radio frequency interference (RFI) issue may advantageously be minimized.

More details and aspects are mentioned in connection with the examples described above and/or below. The example shown in FIG. 3 may comprise one or more optional additional features corresponding to one or more aspects mentioned in connection with the proposed concept or one or more examples described above (e.g., FIG. 1) and/or below (e.g., FIG. 3-20).

Figure 3:
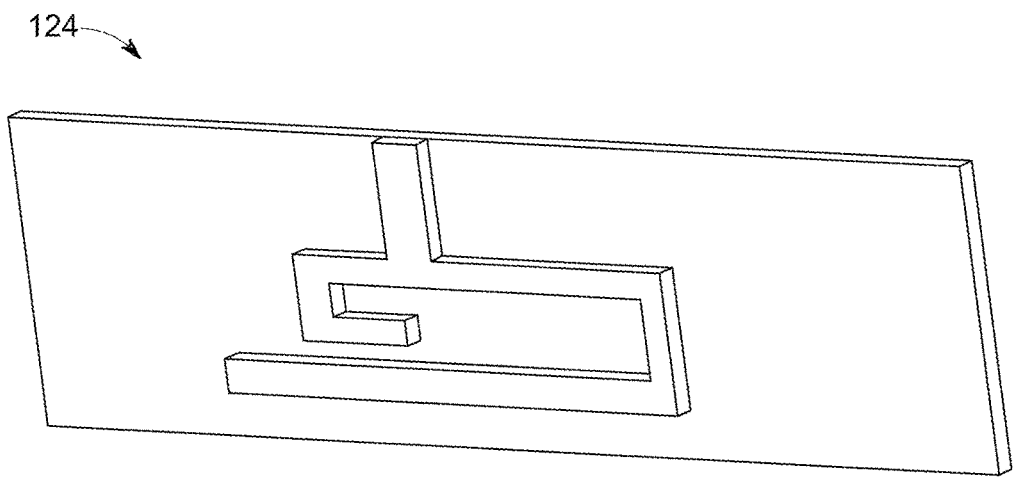
FIG. 3 shows a schematic view of an example of non-conducting material.

FIG. 3 shows a schematic view of an example of non-conducting material. The non-conducting material 124 may be used to fill an opening for a slot antenna. For example, the non-conducting material may be inserted in the chassis as shown in FIG. 1.

More details and aspects are mentioned in connection with the examples described above and/or below. The example shown in FIG. 3 may comprise one or more optional additional features corresponding to one or more aspects mentioned in connection with the proposed concept or one or more examples described above (e.g., FIG. 1-2) and/or below (e.g., FIG. 4-20).

FIG. 4 shows a schematic view of an example of an unfolded chassis. The chassis may comprise a first chassis part 117 (D-cover) and a second chassis part 118 (C-Cover). The second chassis part 118 may comprise a lateral part 115 with a height z 114. A slot antenna 120 may be formed by an opening 122 and a second opening 123 and both openings 122, 123 may be filled by a non-conducting material 124 with a base 125.

Figures 4A, 4B:
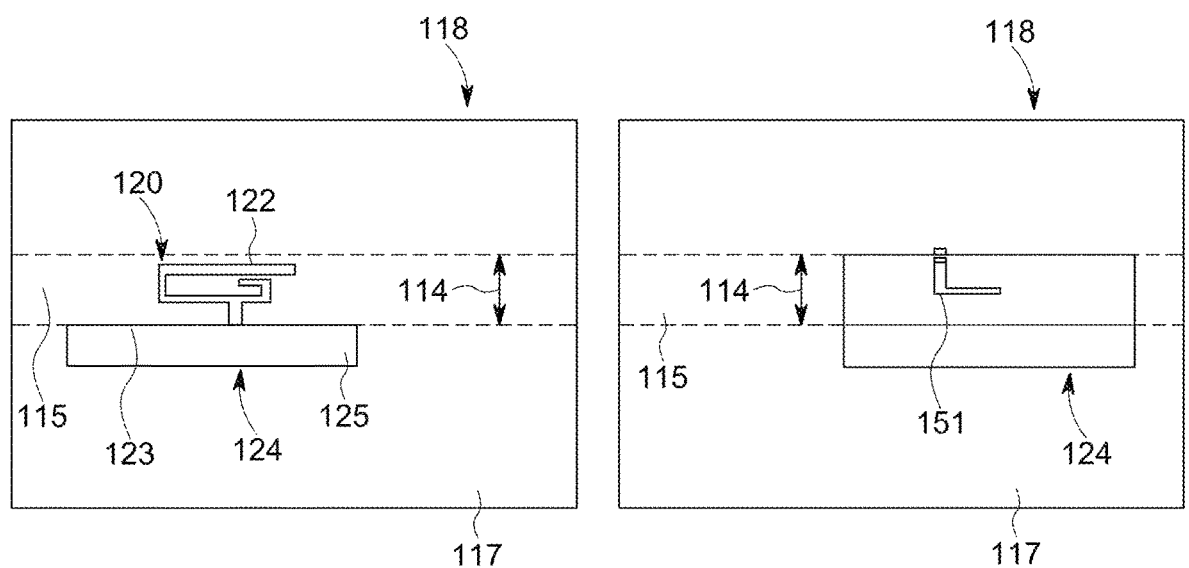
FIGS. 4*a* and 4*b* show a schematic view of an example of an unfolded chassis.

FIG. 4a shows an outer view of the chassis, thus the slot antenna 120 and both openings can be seen.

FIG. 4b show an inner view of the chassis, thus the slot antenna and both openings may be covered by the non-conducting material 124. However, an exciter 151 of an antenna feed can be seen in FIG. 4b. The exciter 151 may have a L-shape. The exciter 151 may be made of metal. The exciter 151 may be made on a flexible printed circuit board (FPC) or on a printed circuit board (PCB). Alternatively, the exciter 151 may stick directly on the non-conducting material 124. The exciter 151 may be used to proximity feed the slot antenna 120.

FIG. 4 shows an example of a 2D-drawing of the proposed antenna in a laptop base when C-cover, D-cover and Z-edge of the laptop are unfolded. Gray color in the figure may show a metal, while white color may show a non-metal filled area. The dotted line may show folding edges of the chassis. The opening 122 may be made in the C-cover 118 and/or in the D-cover 117. The non-conducting material 124 may be used to fill the opening 122 for a slot antenna. For example, the non-conducting material 124 may be inserted in the chassis as shown in FIG. 1.

More details and aspects are mentioned in connection with the examples described above and/or below. The example shown in FIG. 4 may comprise one or more optional additional features corresponding to one or more aspects mentioned in connection with the proposed concept or one or more examples described above (e.g., FIG. 1-3) and/or below (e.g., FIG. 5-20).

Figure 5:
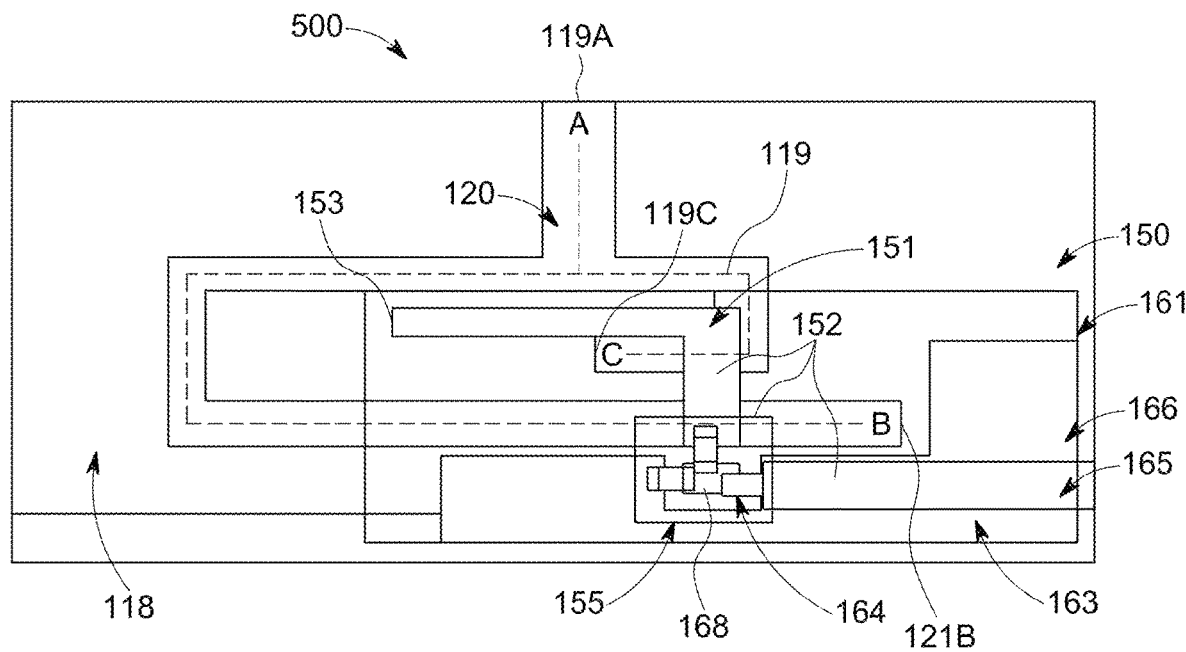
FIG. 5 shows an example of a cutout and an antenna feed.

FIG. 5 shows an example of a cutout and an antenna feed. The chassis shown in FIG. 1 may be implemented in the electronic device 500. For example, the electronic device 500 comprises a chassis described above and an antenna feed 150 configured to excite the at least one slot antenna 120 based on a feed signal. The slot antenna 120 may be formed in a second part 118 of the chassis.

The antenna feed 150 may comprise an exciter 151, which may be proximity coupled to the at least one slot antenna 120. Thus, a contact of the exciter 151 with the slot antenna 120 for applying a feed signal may advantageously be omitted. For example, a chassis with a slot antenna 120 may be produced in a facilitated process independently of other assembling processes. Further, a replacement of the antenna feed 150 may be facilitated.

The antenna feed 150 may be formed on a printed circuit board or on a flexible printed circuit board. Thus, an assembling of the antenna feed 150 and the chassis and/or a replacement of the antenna feed 150 may be facilitated.

The antenna feed 150 may comprise a feed line 152 and the feed line 152 may form a short circuit. Alternatively, the antenna feed 150 may comprise a feed line 152 and the feed line 152 may form an open circuit. Thus, the feed line 152 may advantageously be adjusted to an operation mode. The feed line 152 may comprise the exciter 151, a matching circuit 155 and a coaxial cable 163.

The antenna feed 150 may comprise an impedance matching circuit 155. The matching circuit 155 may be Pi-type or a L-type or a T-type matching circuit. Thus, an impedance matching of the antenna feed 150 may be improved by a chosen matching circuit 155 and may be adjusted for an operation mode.

The antenna feed 150 may comprise a feed line 152 passing through an opening in a radiation shielding of the electronic device 500 that electrically shields the slot antenna 120 from an interior of the chassis. A part of the feed line 152, which passes through the opening may be formed by a coaxial cable 163. Further, the feed line 152 (e.g., the coaxial cable 163) may be enclosed by a sleeve of conducting material that covers the opening in the radiation shielding. Thus, the exciter 150 may be fed by a feed signal generate by an electronic feeding circuitry arranged on a different side of the radiating shielding as the exciter 150. Therefore, an electromagnetic signal, which may be generated by this electronic device may be shielded by the radiation shielding. For example, the exciter 150 may be shielded by the radiation shielding against an electromagnetic signal of the electronic feeding circuitry. Thus, an excitation/operation of the slot antenna 120 may be improved by the radiation shielding. The sleeve of conducting material that covers the opening in the radiation shielding may further improve an excitation/operation of the slot antenna 120. For example, the sleeve may shield radiation that may otherwise pass through the opening, thus a shielding of the slot antenna 120 may be improved.

The slot antenna 120 may comprise at least two slots 119, 121 adapted for transmitting and receiving at two different wavelengths. A first slot 119 may be formed by a path A-C (path from point A to point C). A length of the path A-C may be measured from edge 119A to edge 119C. For example, the length of path A-C may be the distance between a first edge 119A and a second edge 119C. The second slot may be formed by a path A-B (path from point A to point B). A length of the path A-B may be measured from edge 119A to edge 121C. For example, the length of path A-B may be the distance between a first edge 119A and a third edge 121B. The length of each path may be determined by $\lambda_i/4$, with $\lambda_i$ a desired frequency for radiation.

For example, the path A-C may be adjusted for a first frequency of at least 2.1 GHz, or at least 2.2 GHz, or at least 2.3 GHz and/or at most 2.6 GHz, or at most 2.5 GHz, or at most 2.4 GHz. For example, the path A-B may be adjusted for a second frequency of at least 5 GHz, or at least 5.2 GHz, or at least 5.4 GHz and/or at most 6.1 GHz, or at most 5.9 GHz, or at most 5.7 GHz, or at most 5.5 GHz. Thus, the two slots 119, 121 may have two different resonance frequencies. For example, each slot 119, 121 may work as magnetic monopole antenna. Therefore, the slot antenna 120 comprising two slots 119, 121 may work as multiband antenna, which may facilitate a manufacturing process of a multiband antenna of an electronic device.

The antenna feed 150 may be arranged to excite the at least two slots 119, 121 at the same time. Thus, a multiband operation of the slot antenna 120 may advantageously be achieved with only one antenna feed 150.

The electronic device 500 may be a mobile device, e.g., a laptop or a foldable smartphone.

FIG. 5 shows an example of a slot and a feeding structure, e.g., the antenna feed 150. The slot antenna 150 may have two sections 119, 121. A first section 121 may be formed from point A to point B, which may give resonance for a lower frequency band at 2.4 GHz. A length between point A and point B may be approximately $\lambda_i/4$ with $\lambda_i$=2.4 GHz. A second section 119 may be formed from point A to point C, which may give a resonance for a higher frequency band 5 GHz-6 GHz. The length between point A to point C may be approximately $\lambda_i/4$ with $\lambda_i$=5.5 GHz. The different slot lengths for the different sections 119, 121 may yield to two resonance frequency bands and these slots may work as magnetic monopole antenna, each. The slot antenna 150 may be tuned for different wireless local area network-6E (WLAN-6E) frequency bands (2.4 GHz, 5 GHz and 6 GHz). The 2.4 GHz frequency band may be 2400-2500 MHz, the 5 GHz frequency band may be 5180-5825 MHz and the 6 GHz frequency band may be 5925-7125 MHz.

The sections (e.g., the slots forming each section) may be excited using a proximity coupled antenna feeding method. A feed line 152 (e.g., the exciter 151) may be routed in a way that it couples to both sections 119, 121 (point A to point B and point A to point C) simultaneously. An intersection of the feed line 152 and then sections may be offset from a short end of each section to, which may improve an impedance matching.

The antenna feed 150 may be formed on a supporting element 161, e.g., FPC, PCB or a metal plate. The antenna feed 150 may be arranged behind the slot antenna 150 by gluing, e.g., by gluing the antenna feed 150 or the supporting element 161. For example, the antenna feed 150 or the supporting element 161 may be glued to a backside of the non-conducting material. A RF coaxial cable 163 may be used to connect the antenna feed 150 to a RF-modem. One end of the coaxial cable 163 may be connected to a coupling element 168 and another end may be connected to the RF-modem (not shown). An outer conductor 165 of the coaxial cable 163 may be used for grounding. For example, the outer conductor may be connected to a FPC ground 166. For example, the FPC ground 166 may be connected to the chassis. An inner conductor 164 of the coaxial cable 163 may be connected/soldered to the coupling element 168. An end 153 of the feed line 152 may have an impact on impedance matching. Thus, the feed line 152 may be formed as an open circuit or a short circuit. A short circuit may be formed by using a spring connector or a screw to contact the feed line 152 with a part of the chassis (see FIG. 7).

More details and aspects are mentioned in connection with the examples described above and/or below. The example shown in FIG. 5 may comprise one or more optional additional features corresponding to one or more aspects mentioned in connection with the proposed concept or one or more examples described above (e.g., FIG. 1-4) and/or below (e.g., FIG. 6-20).

Figure 6:
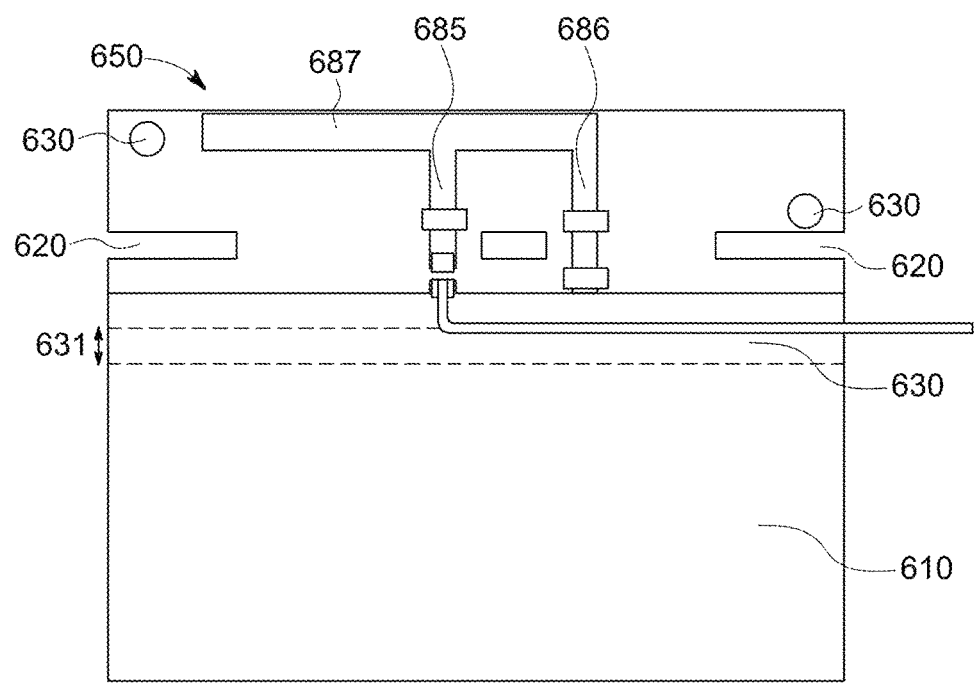
FIG. 6 shows an antenna feed.

FIG. 6 shows an antenna feed. The antenna feed 650 may be implemented in the electronic device of FIG. 5.

The electronic device may further comprise a conductive element 610 attached to the antenna feed 650 for grounding the antenna feed 650. Thus, a grounding of the antenna feed 650 may be facilitated by connecting the conductive element 610 with a part of the chassis. The conductive element 610 may be attached to the antenna feed 650 by overlapping a part of the conductive element 610 with a part of the antenna feed 650 in an overlap area 630 with a predefined width 631. Thus, a solid connection may be ensured in an easy way, e.g., by soldering both elements in the overlap area 630. The conductive element 610 may be made of metal (e.g., copper). The conductive element 610 may be used for grounding the antenna feed 650. For example, the conductive element 610 may be connected to the chassis. Thus, a grounding of the antenna feed 650 may be facilitated by the grounding element 630.

The antenna feed 650 may comprise at least one recess 620 for facilitating bending of the antenna feed 650. By bending the antenna feed 650 a space required for the antenna feed 650 may be advantageously decreased. Thus, the antenna feed 650 may be placed in a smaller space, which may lead to a more compact shape of an electronic device. For example, a height of the chassis (e.g., a z-height of the C-cover) may be reduced.

The antenna feed 650 may comprise at least one recess 630 configured to receive an attaching element for attaching the antenna feed 650 to the chassis. Thus, an attaching of the antenna feed 650 may be facilitated. Further, the antenna feed 650 may be easily arranged at a predefined position, e.g., by marks on the chassis that correspond to the at least one recess 630.

The antenna feed 650 for exciting an antenna comprises may comprise a first feed line 685, a second feed 686 line and a third feed line 687. The third feed line 687 may connect the first feed 685 line with the second feed line 686 and the second feed line 686 may be longer as the first feed line. For example, the three feed lines 685, 686, 687 may form a F-shape. By the three feed lines 685, 686, 687 a simultaneously excitation of both section of a slot antenna may be improved. Thus, a performance of a multiband slot antenna may be increased by the three feed lines 685, 686, 687.

The antenna feed 650 may further comprise a cable connected to the first feed line for receiving a feed signal. The antenna feed 650 may further comprise at least one impedance matching circuit arranged at an end region of the first feed line or the second feed line.

More details and aspects are mentioned in connection with the examples described above and/or below. The example shown in FIG. 6 may comprise one or more optional additional features corresponding to one or more aspects mentioned in connection with the proposed concept or one or more examples described above (e.g., FIG. 1-5) and/or below (e.g., FIG. 6-20).

Figure 7A:
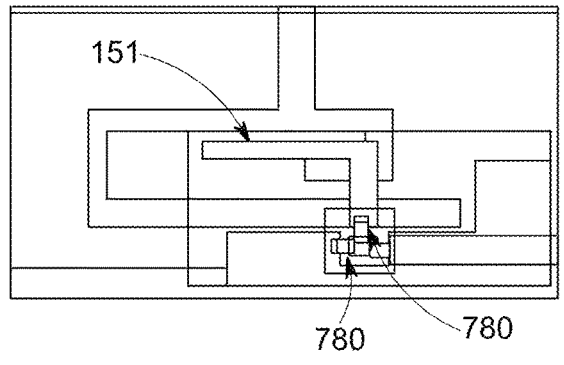
FIGS. 7*a* and 7*b* show examples of antenna feeds.
Figure 7B:
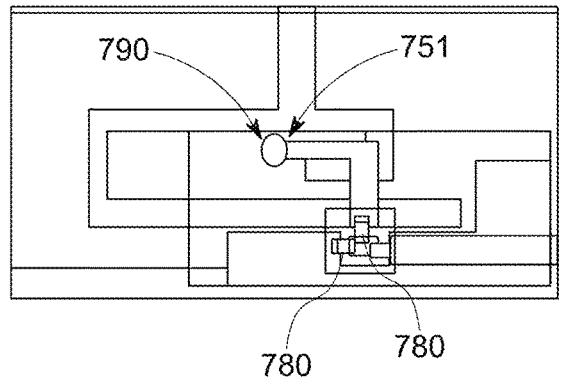

FIG. 7 shows examples of antenna feeds. The antenna feeds may be implemented in the electronic device of FIG. 5. In FIG. 7*a* an exciter 151 of the antenna feed may form an open circuit. In FIG. 7*b* an exciter 751 of the antenna feed may form a short circuit. The short circuit may be formed by connecting an end of the feed line by a connection element 790, (e.g., a spring connector or a screw) to the chassis. Further, an impedance matching may be improved by tuning components 780 of a matching circuit.

An antenna performance may be achieved by utilizing an open-end feed line without an external matching circuit. But generally, an antenna may get detuned (e.g., a shift in a resonance frequency and impedance mismatch) for different system environment and system assembling. To compensate a detuning, a matching circuit, e.g., a L-type or P-type matching circuit, may be used. The matching circuit may be arranged between a coupler and a coaxial cable feed.

More details and aspects are mentioned in connection with the examples described above and/or below. The example shown in FIG. 7 may comprise one or more optional additional features corresponding to one or more aspects mentioned in connection with the proposed concept or one or more examples described above (e.g., FIG. 1-6) and/or below (e.g., FIG. 7-20).

Figure 8:
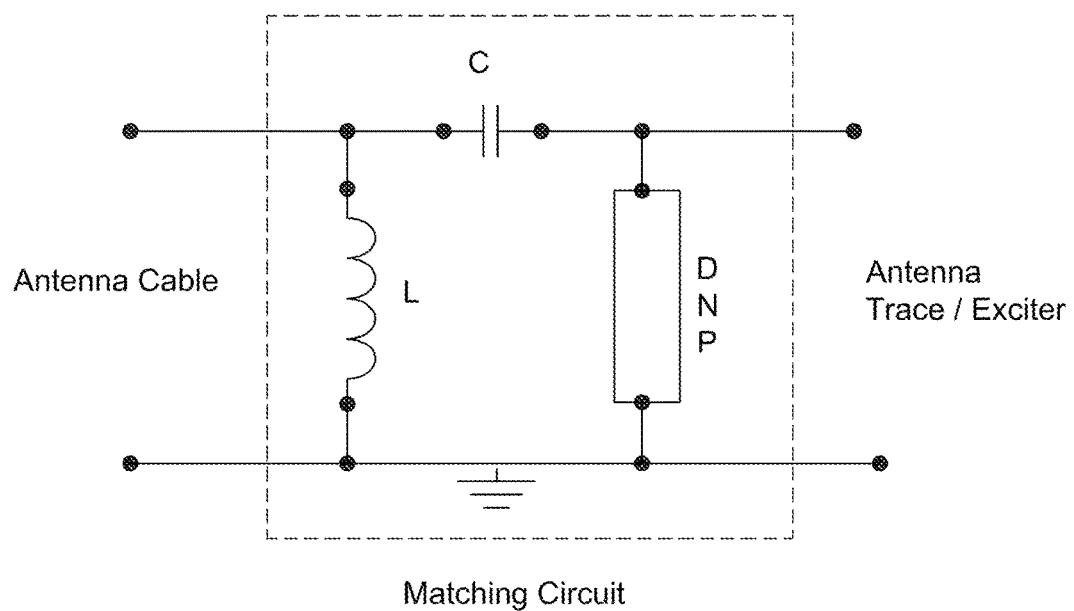
FIG. 8 shows a matching circuit for an antenna feed.

FIG. 8 shows a matching circuit for an antenna feed. The matching circuit may be integrated in any antenna feed shown in FIG. 5-7. The antenna feed may be tuned by the L-type or P-type matching circuit. FIG. 8 shows a P-type matching circuit. A component near an antenna trace (feed line) may be omitted. If a component near the antenna trace may be omitted (DNP: do not populate) the matching circuit may be effectively a L-type. FIG. 8 shows a shunt inductor (L) and a series capacitor (C). The matching circuit shown in FIG. 8 shows an example of one possibility for forming a matching circuit. Alternatively, a matching circuit may be any combination of LC components.

More details and aspects are mentioned in connection with the examples described above and/or below. The example shown in FIG. 8 may comprise one or more optional additional features corresponding to one or more aspects mentioned in connection with the proposed concept or one or more examples described above (e.g., FIG. 1-7) and/or below (e.g., FIG. 9-20).

Figure 9:
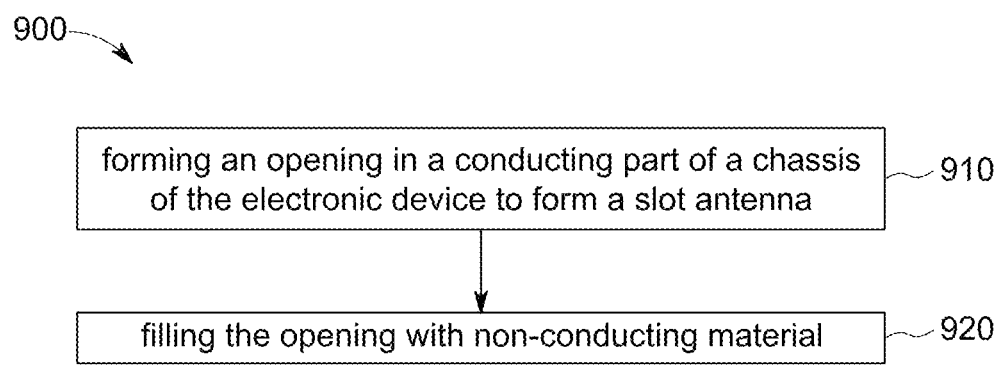
FIG. 9 shows a flow-chart of an example of a method for fabricating an electronic device.

FIG. 9 shows a flow-chart of an example of a method for fabricating an electronic device. The method 900 comprises forming 910 an opening in a conducting part of a chassis of the electronic device to form a slot antenna and filling 920 the opening with non-conducting material.

Forming 910 the opening may be accomplished by cutting out a part of the conducting chassis part, e.g., by laser cutting or mechanical cutting.

Filling 920 the opening may be accomplished by arranging a non-conducting material in the opening.

The method may further comprise arranging an antenna feed within the chassis such that the antenna feed and the slot antenna may be proximity coupled. This may be done by gluing the antenna feed to the chassis and/or to the non-conducting material.

The method may further comprise arranging a radiation shielding within the chassis such that the radiation shielding at least partially encloses the slot antenna and the antenna feed within the chassis in order to shield the slot antenna and the antenna feed from electromagnetic radiation emitted by other electronic circuitries of the electronic device.

More details and aspects are mentioned in connection with the examples described above and/or below. The example shown in FIG. 9 may comprise one or more optional additional features corresponding to one or more aspects mentioned in connection with the proposed concept or one or more examples described above (e.g., FIG. 1-8) and/or below (e.g., FIG. 10-20).

Figure 10:
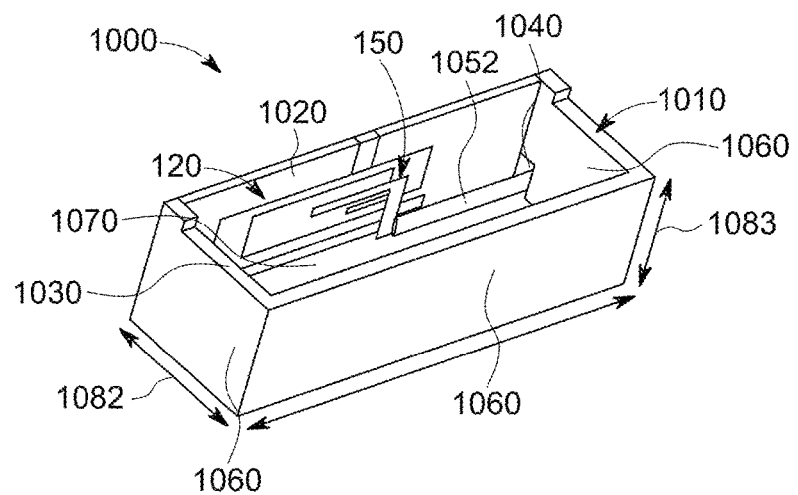
FIG. 10 shows a schematic view of an example of an antenna module.

FIG. 10 shows a schematic view of an example of an antenna module. The antenna module 1000 may be implemented in an electronic device. For example, an electronic device may be retrofitted with an antenna module 1000. Alternatively, the antenna module 1000 may be implemented in an electronic device described in FIG. 5 replacing the slot antenna formed in the chassis 1010. Thus, a replacement of an antenna of the electronic device may be facilitated by replacing the antenna module 1000.

The antenna module 1000 comprises a chassis 1010, which may comprise a chassis part 1020 made of conducting material and a chassis part made of non-conducting material. Further, a slot antenna 120 is formed in the chassis part 1020 made of conducting material. Further, an antenna feed 150 is arranged within the chassis 1010 and configured to excite the slot antenna 120 based on a feed signal. For example, the antenna feed may comprise an exciter, which is arranged to proximity feed the slot antenna 120.

The part 1020 of the chassis 1010 made of conducting material may be made of a metal, a semiconductor or a conductive polymer. The part of the chassis 1010 made of non-conducting material may be made of a polymer, e.g., plastic.

All sides of the chassis 1010 may be made of conducting material except one side comprising the chassis part made of a non-conducting material. The part made of non-conducting material may be formed by a base of the non-conducting material used to fill the opening of the slot antenna 120. For example, the chassis 1010 may have on open side 1030, in which a base of the non-conducting material to fill the opening may be arranged that forms the one side of the chassis 1010.

The antenna module 1000 may comprise an opening 1040 for a feed line 1052 coupled to the antenna feed. The feed line 1052 may be enclosed by a sleeve of conducting material that covers the opening in a radiation shielding. The radiation shielding may comprise three conducting sides 1060 of the chassis 1010. For example, the radiation shielding may form a space 1070 in a plane on one side of the slot antenna 120 that may be shielded against electromagnetic signals from other electronic circuitries of the electronic device. For example, two opposing sides of the radiation shielding may be in contact with the chassis part 1020 in which the slot antenna 120 may be formed. Thus, between the opposing sides of the radiation shielding the space 1070 may be formed.

It goes without saying, that the features described above for a chassis of an electronic device may be applicable for the antenna module 1000 as well and vice versa.

A mobile device such as, e.g., a laptop-computer, a tablet-computer or a smartphone may comprise the antenna module 1000.

FIG. 10 shows an isometric view of an antenna module 1000. The proposed antenna solution (described above) may be used as an antenna module 1000. A side of the antenna module 1000 may comprise the slot antenna 120 and another side may be made of non-conducting material. All sides of the antenna module 1000 except of the other side may be made of metal. The slot antenna 120 may be excited using a conductive trace (e.g., a metallic exciter) arranged behind the slot antenna 120. The excitation trace may be formed on FPC, PCB or metal plate. The slot antenna 120 may be proximately coupled and may radiate and/or receive electromagnetic waves at a desired frequency band. A feed line 1052 (e.g., a coaxial cable) may be led through an opening 1040 in the antenna module 1000 and may be connected to the trace forming a connection between a RF-module and the trace.

The opening 1040 may be a small hole in the antenna module 1000 that may be made to pass the coaxial cable and connection of the antenna trace (antenna coupling element). An undesired electromagnetic signal may pass through the opening 1040 and may result in RF-interference (RFI). Thus, an excitation/performance of the slot antenna may be decreased if the opening 1040 may be not properly shielded. This issue may be resolved by a hole shielding mechanism (e.g., formed by the sleeve, see FIG. 11). The shielding mechanism may be a metal structure, which may be circular shaped or shaped in any desired way to connect an outer conductor of the feed line 1052 with the radiation shielding of the antenna module 1000 to fill an air gap between feed line 1052 and radiation shielding.

The antenna module 1000 may be integrated in a base and/or a lid of a laptop or a dual display system (e.g., a foldable smartphone). The antenna module 1000 may have a length 1081 of at least 20 mm, or at least 22 mm, or at least 24 mm and/or at most 30 mm, or at most 28 mm, or at most 26 mm. The antenna module 1000 of may have a width 1082 of at least 5 mm, or at least 6 mm, or at least 7 mm and/or at most 10 mm, or at most 9 mm, or at most 8 mm. The antenna module 1000 of may have a height 1083 of at least 5 mm, or at least 6 mm, or at least 7 mm and/or at most 10 mm, or at most 9 mm, or at most 8 mm.

More details and aspects are mentioned in connection with the examples described above and/or below. The example shown in FIG. 10 may comprise one or more optional additional features corresponding to one or more aspects mentioned in connection with the proposed concept or one or more examples described above (e.g., FIG. 1-9) and/or below (e.g., FIG. 11-20).

Figure 11:
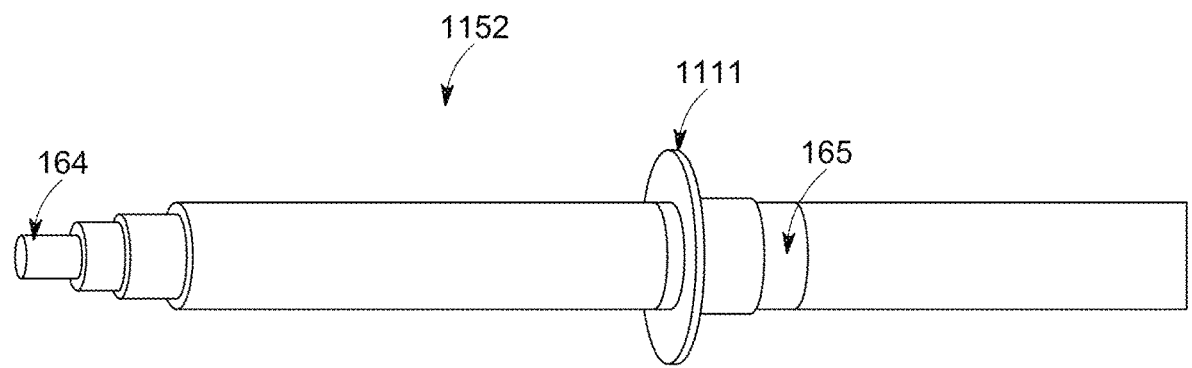
FIG. 11 shows a schematic view of an example of a feed line.

FIG. 11 shows a schematic view of an example of a feed line. The feed line 1152 may be a coaxial cable 1152. The coaxial cable 1152 may comprise an inner conductor 162, an outer conductor 165 and a sleeve 1111. The sleeve 1111 may be in contact with the outer conductor 165 of the coaxial cable 1152. Thus, an opening of a radiation shielding may be closed advantageously by the feed line 1152.

More details and aspects are mentioned in connection with the examples described above and/or below. The example shown in FIG. 11 may comprise one or more optional additional features corresponding to one or more aspects mentioned in connection with the proposed concept or one or more examples described above (e.g., FIG. 1-10) and/or below (e.g., FIG. 12-20).

Figure 12:
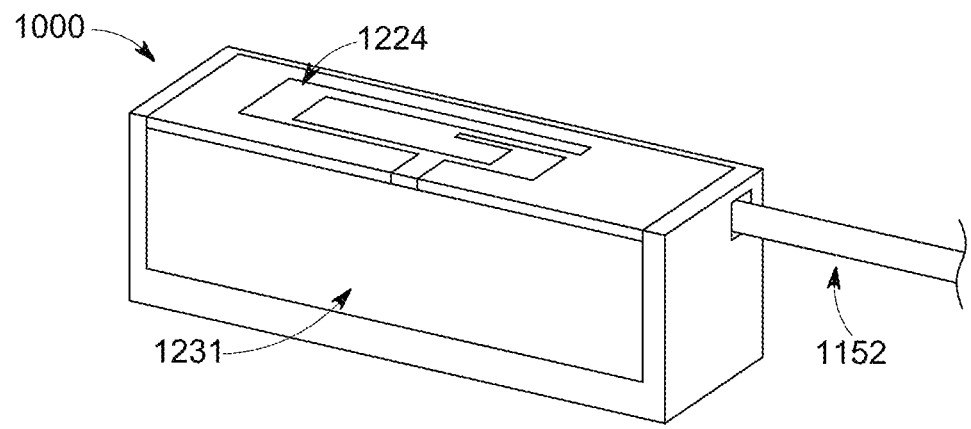
FIG. 12 shows a schematic view of an example of an antenna module.

FIG. 12 shows a schematic view of an example of an antenna module. The antenna module 1000 may comprise a feed line 1152 and a non-conducting material 1224 with a base 1231 to fill the opening of the slot antenna. The base 1231 of the non-conducting material may form one side of the chassis, e.g., one side comprising the chassis part made of non-conducting material.

More details and aspects are mentioned in connection with the examples described above and/or below. The example shown in FIG. 12 may comprise one or more optional additional features corresponding to one or more aspects mentioned in connection with the proposed concept or one or more examples described above (e.g., FIG. 1-11) and/or below (e.g., FIG. 13-20).

Figure 13:
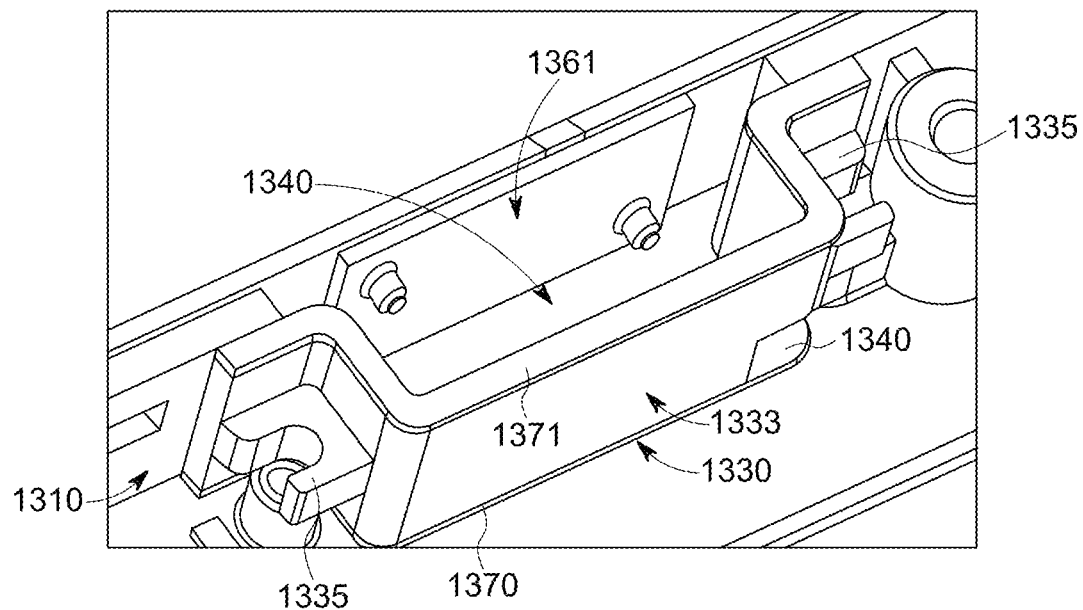
FIG. 13 shows a schematic view of an example of a radiation shielding arranged in an electronic device.

FIG. 13 shows a schematic view of an example of a radiation shielding arranged in an electronic device. The radiation shielding 1330 may comprise a metal element 1333, two conducting gaskets 1370, 1371 and an attaching structure 1335, e.g., a screw boss, to connect the radiation shielding 1330 with the chassis. A slot antenna may be formed in a conducting part 1310 of the chassis, e.g., a lateral part, and may be covered by a supporting element 1361 of an antenna feed.

The electronic device comprises an antenna arranged in a lateral part of a chassis of the electronic device, an electronic circuitry and a radiation shielding 1330 arranged in the lateral part of the chassis and between the antenna and the electronic circuitry. The radiation shielding 1330 may be configured to shield the antenna from electromagnetic radiation emitted by the electronic circuitry.

The lateral part of the chassis may be an area besides an edge of the chassis. The lateral part may extend from an edge of the chassis to a distance from the edge of at most 2% (or at most 5% or at most 10% or at most 15%) of a width of the chassis. Thus, the radiation shielding 1330 may be arranged next to the slot antenna. By arranging the radiation shielding 1330 in a lateral part a material requirement for a radiation shielding 1330 may be reduced. A plate arranged in front of electronic circuitries of an electronic device may be omitted, because the radiation shielding 1330 may generate a space without electromagnetic signals from these circuitries in a lateral space of the electronic device. In this space the slot antenna may be arranged, which may result in a decreased material requirement for the radiation shielding 1330.

The radiation shielding 1330 may partially enclose the slot antenna. For example, the radiation shielding 1330 may be in contact with the lateral part in which the slot antenna may be formed. For example, the radiation shielding 1330 may be in contact with the lateral part at two positions besides the slot antenna. A height of the radiation shielding 1330 may be identical to a height of the lateral part. Thus, the radiation shielding 1330 may enclose one side of the lateral part entirely. Thus, an electromagnetic signal generated in an inside of the chassis may be shielded by the radiation shielding 1330 resulting in a decreased electromagnetic signal intensity in the space formed by the radiation shielding 1330.

The electronic device may further comprise at least one conducting gasket 1370, 1371 arranged between the radiation shielding 1330 and a part of the chassis. For example, the conducting gasket 1370, 1371 may be a part of the radiation shielding 1330. A contact between the radiation shielding 1330 and the chassis may be improved by the conducting gasket 1370, 1371, which may lead to an increased shielding caused by the radiation shielding 1330.

The electronic device may further comprise two conducting gaskets 1370, 1371 arranged between the radiation shielding 1330 and a respective part of the chassis. The two conducting gaskets 1370, 1371 may be arranged at opposite sides of the radiation shielding 1330. For example, the two conducting gaskets 1370, 1371 may be a part of the radiation shielding 1330. A contact between the radiation shielding 1330 and the chassis may be improved by the two conducting gaskets 1370, 1371, which may lead to an increased shielding caused by the radiation shielding 1330. A first conducting gasket 1371 may be in contact with a first chassis part (e.g., a part of a D-cover) and a second conducting gasket 1370 may be in contact with a second chassis part (e.g., a part of a C-cover).

The radiation shielding 1330 may be made of conducting material, e.g., metal.

The radiation shielding 1330 may be detachable from the electronic device. For example, the radiation shielding 1330 may be attached by use of the attaching structure 1335, e.g., a screw, may be used to attach the radiation shielding 1330 to the chassis. Thus, an assembling process of the electronic device may be facilitated by first assembling a feed line and/or leading a feed line through the opening and then assembling the radiation shielding 1330.

The electronic device may further comprise a feeding element. The feeding element may be arranged within a space 1340 formed by the radiation shielding 1330 around the antenna. The feeding element may be proximity coupled to the antenna.

The electronic device may further comprise a feed line coupled to the feeding element and passing through an opening 1340 in the radiation shielding 1330. The feed line may be enclosed by a sleeve of conducting material that covers the opening 1340 in the radiation shielding 1330.

The radiation shielding 1330 may have a U-shape. Thus, the radiation shielding 1330 may efficiently enclose one side of the slot antenna formed in a lateral part entirely.

FIG. 13 shows an internal structure with radiation shielding 1330, e.g., a metal barricade. If an antenna may be placed in a chassis, e.g., a base of a laptop, RFI issue may occur. To mitigate the RFI issue, a shielding box may be used to cover sources of interference/noise sources. Such shielding box may be costly and may occupy space in the motherboard. So a simple cost-effective solution may be provided, by shielding the antenna with a metal cavity, e.g., a radiation shielding 1330 arranged in a lateral part of the electronic device. A discussion of the RFI issue is shown in FIG. 14.

More details and aspects are mentioned in connection with the examples described above and/or below. The example shown in FIG. 13 may comprise one or more optional additional features corresponding to one or more aspects mentioned in connection with the proposed concept or one or more examples described above (e.g., FIG. 1-12) and/or below (e.g., FIG. 14-20).

Figure 14A:
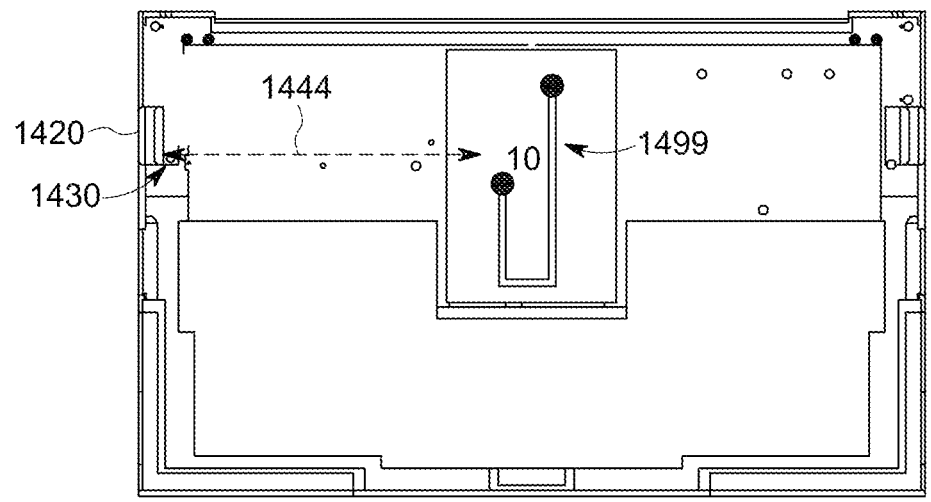
FIG. 14*a* shows a schematic view of an example an example of an electronic device.
Figure 14B:
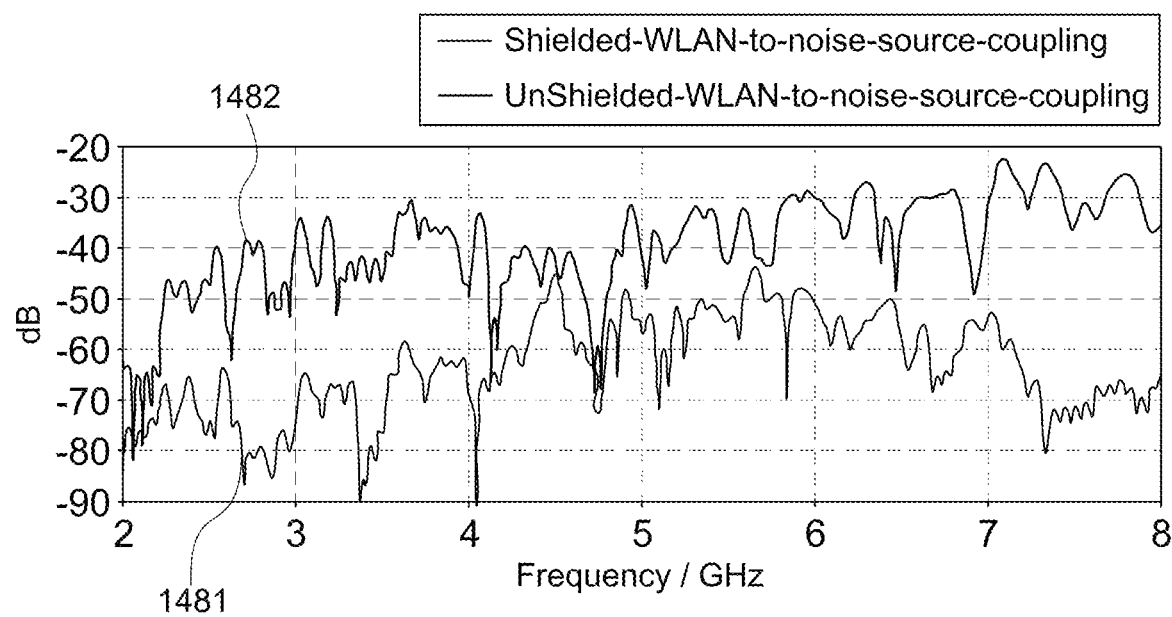
FIG. 14*b* shows a simulation of a slot antenna performance for the electronic device of FIG. 14*a*.

FIG. 14a shows an example of an electronic device. To analysis a RFI issue, a radiation shielding 1430 and a microstrip line (noise source) are arranged in a distance d 1444 of d=150 mm in a chassis. The slot antenna 1420 may be arranged on a lateral part of the chassis. FIG. 14b shows a simulation of a slot antenna performance for the electronic device of FIG. 14a. The simulation shows the S11-parameter in dB as a function of the frequency for a shielded 1481 (radiation shielding is used) slot antenna and an unshielded 1482 (no radiation shielding is used) slot antenna. A RFI/coupling may be reduced by ~20 dB in all WLAN frequency bands for the usage of the radiation shielding. Thus, the radiation shielding may improve a performance of the slot antenna.

More details and aspects are mentioned in connection with the examples described above and/or below. The example shown in FIG. 4 may comprise one or more optional additional features corresponding to one or more aspects mentioned in connection with the proposed concept or one or more examples described above (e.g., FIG. 1-13) and/or below (e.g., FIG. 15-20).

FIG. 15 show schematic views of different examples of a slot antenna. FIG. 15a shows a G-shaped slot antenna from FIGS. 1, 2, 4a, 7a, 7b, 10 and 12. A width 1510 of the base may be at least 20 mm, or at least 22 mm, or at least 24 mm and/or at most 30 mm, or at most 28 mm, or at most 26 mm. A width 1511 of the G-shaped slot antenna may be at least 9 mm, or at least 10 mm, or at least 11 mm and/or at most 14 mm, or at most 13 mm, or at most 12.2 mm. A distance 1512 from the G-shaped slot antenna to a chassis edge may be at least 2.1 mm, or at least 2.3 mm, or at least 2.5 mm and/or at most 3.1 mm, or at most 2.9 mm, or at most 2.7 mm. A height 1513 of the G-shaped may be at least 2.7 mm, or at least 2.9 mm, or at least 3.1 mm and/or at most 3.7 mm, or at most 3.5 mm, or at most 3.3 mm.

FIG. 15b shows a C-shaped slot antenna. FIG. 15c shows a L-shaped slot antenna.

FIG. 15 show different shapes (pattern) of slot antennas implemented on a Z-edge of chassis. The slot shape (pattern) may be modified or customized based on design requirement and/or an industrial design of an electronic device. Slot shapes (pattern) like a G-Shape, a C-Shape or a L-Shape may be used for forming a slot antenna. The design may be suitable for any chassis edge such as a sloped edge or a curved edge of a chassis, e.g., for an edge of a D-cover. A sloped design may help improve the antenna efficiency by giving a plastic area (e.g., a base of the non-conducting material) of a D-cover some distance from a surface on which the electronic device may be placed. Also, the proposed design may be not limited to laptop form factors and may be adapted to any shape and size, i.e., round and other shapes of edges of the chassis.

More details and aspects are mentioned in connection with the examples described above and/or below. The example shown in FIG. 15 may comprise one or more optional additional features corresponding to one or more aspects mentioned in connection with the proposed concept or one or more examples described above (e.g., FIG. 1-14) and/or below (e.g., FIG. 15-20).

FIG. 16 shows a side view of an example of an electronic device. The electronic device may have a footer 1610 (e.g., a rubber foot) at a base of the chassis, e. g a D-Cover 1632. This footer 1610 may create a gap 1620 between a C-cover 1631 (in which a slot antenna may be arranged) to a surface on which the electronic device may be place. Thus, a performance of the slot antenna may be improved due to the gap 1620, e.g., in a desk-mode. Further, an increased slot antenna performance may be achieved by utilizing different industrial designs of electronic devices. For example, electronic devices with curved or sloped D-Cover edges. A plastic cutout for a base of a non-conducting material and for slot antenna may be made in any surface of the chassis.

More details and aspects are mentioned in connection with the examples described above and/or below. The example shown in FIG. 16 may comprise one or more optional additional features corresponding to one or more aspects mentioned in connection with the proposed concept or one or more examples described above (e.g., FIG. 1-15) and/or below (e.g., FIG. 16-20).

FIG. 17 shows simulations of an example of a slot antenna for an electronic device. The simulation is performed for a G-shaped slot antenna with a width of 12.2 mm and a height of 3.3 mm. Further, the simulation is performed with a radiation shielding and a full metal laptop base. For the simulation, the slot antenna is proximity coupled with a metal trace. The trace is formed on a FPC which is glued to an inner side of the chassis, e.g., of the z-edge, behind the slot antenna. The metal trace is coupled to the slot structure and a gap between them provides impedance matching and coupling strength between them. A slot in a D-cover has a width of 26 mm and a length of 3.5 mm and may provide a wider impedance bandwidth.

The slot antenna may be tuned for WLAN-6E frequency bands (2.4 GHz, 5 GHz and 6 GHz). The 2.4 GHz frequency band may be 2400 MHz-2500 MHz, the 5 GHz frequency band may be 5180 MHz-5825 MHz and the 6 GHz frequency band may be 5925 MHz-7125 MHz.

FIG. 17*a* shows a simulation of a magnitude of a S11-parameter in dB as a function of the frequency. The return loss 1700 (S11-parameter in dB) of the slot antenna may be below −6 dB for both frequency bands, which indicates good impedance matching with 50Ω. The achieved return loss and impedance bandwidth may meet requirements of a WLAN-6E antenna. Thus, the proposed slot antenna may be used in an electronic device for WLAN-6E radiation.

Figure 17B:
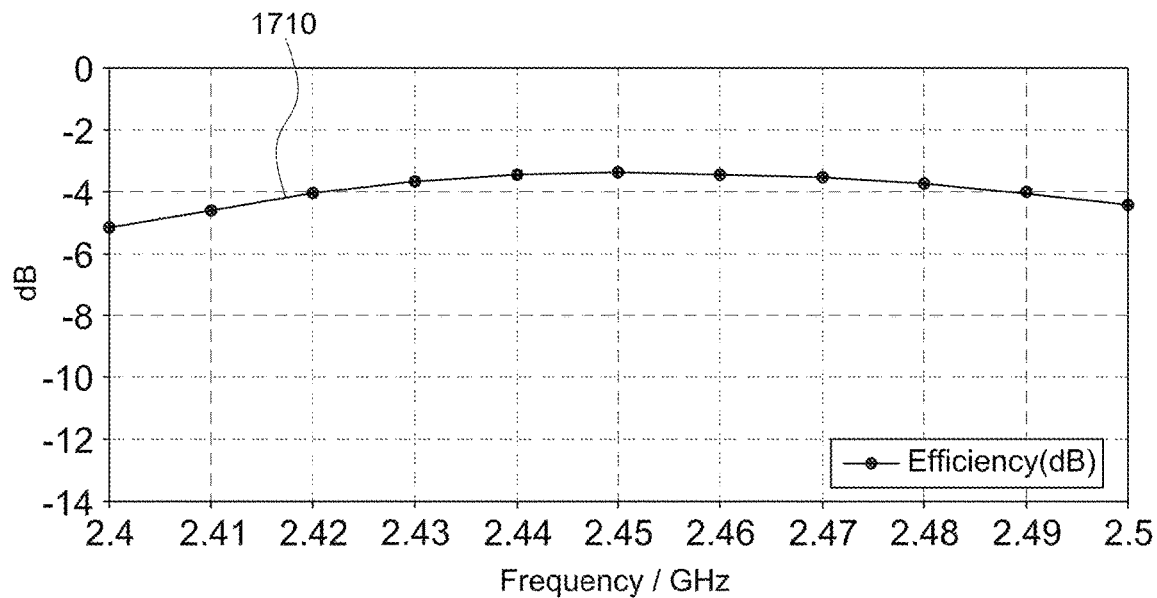
FIGS. 17*a* to 17*n* show simulations of an example of a slot antenna for an electronic device.

FIG. 17*b* shows a simulation of a slot antenna radiation efficiency in dB as a function of the frequency for 2.4-2.5 GHz. The antenna radiation efficiency 1710 may be below −3 dB. Thus, the proposed slot antenna may be used in an electronic device for WLAN-6E radiation.

Figure 17C:
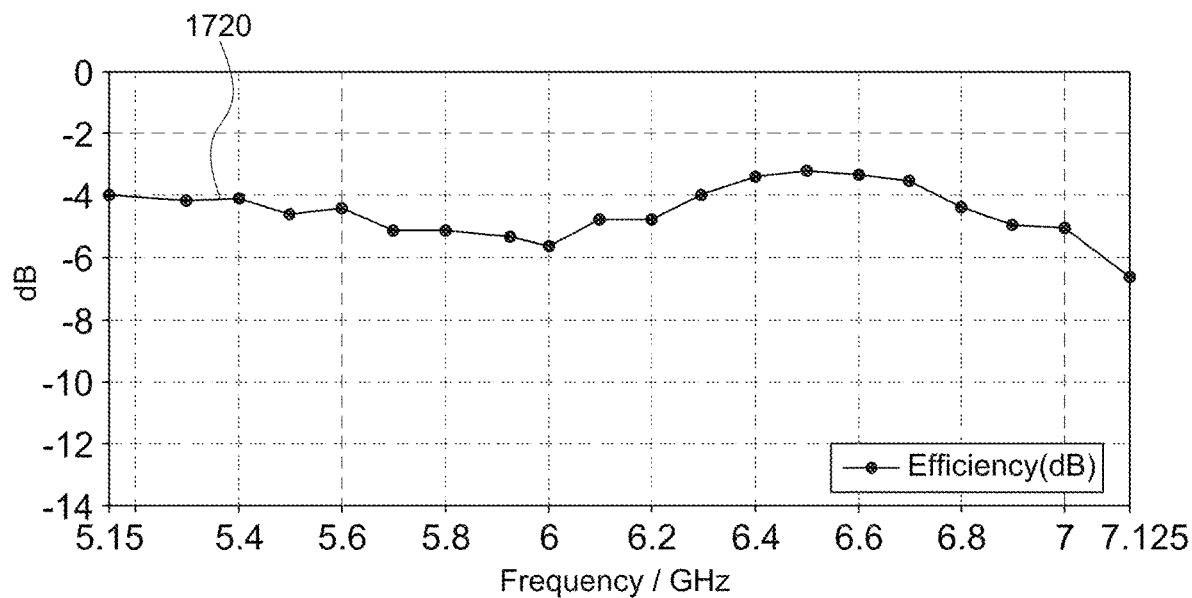

FIG. 17*c* shows a simulation of a slot antenna radiation efficiency in dB as a function of the frequency for 5.1-7.1 GHz. The antenna radiation efficiency 1720 may be below −5 dB. Thus, the proposed slot antenna may be used in an electronic device for WLAN-6E radiation.

Figure 17D:
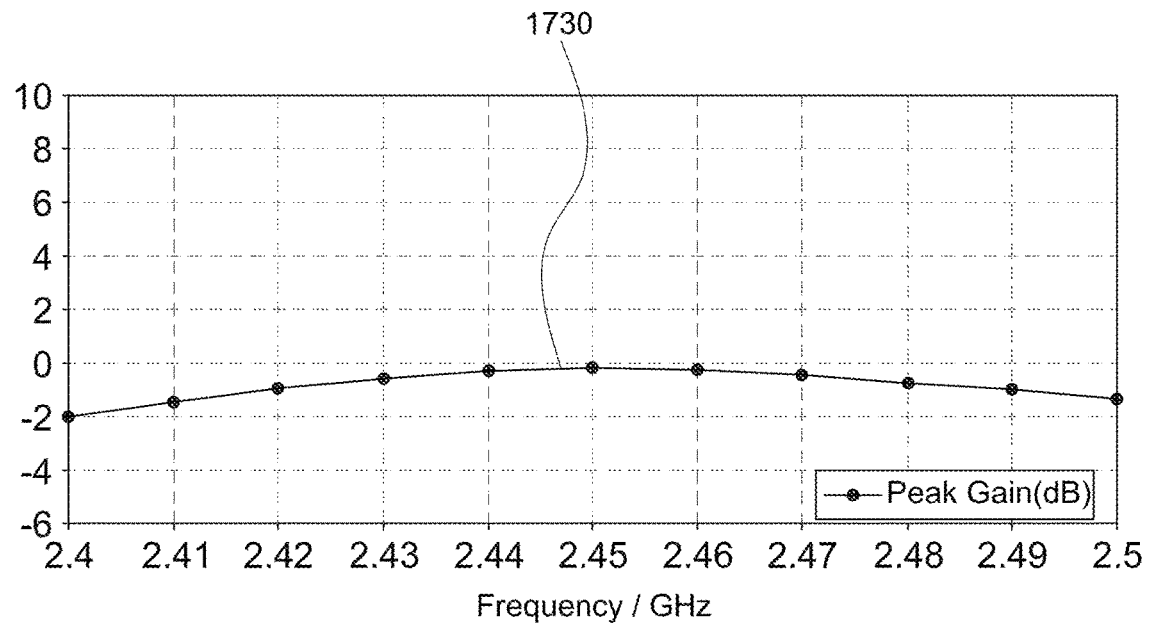

FIG. 17*d* shows a simulation of an antenna peak gain in dB as a function of the frequency for 2.4-2.5 GHz. The slot antenna peak gain may be below 0 dB. Thus, the proposed slot antenna may be used in an electronic device for WLAN-6E radiation.

Figure 17E:
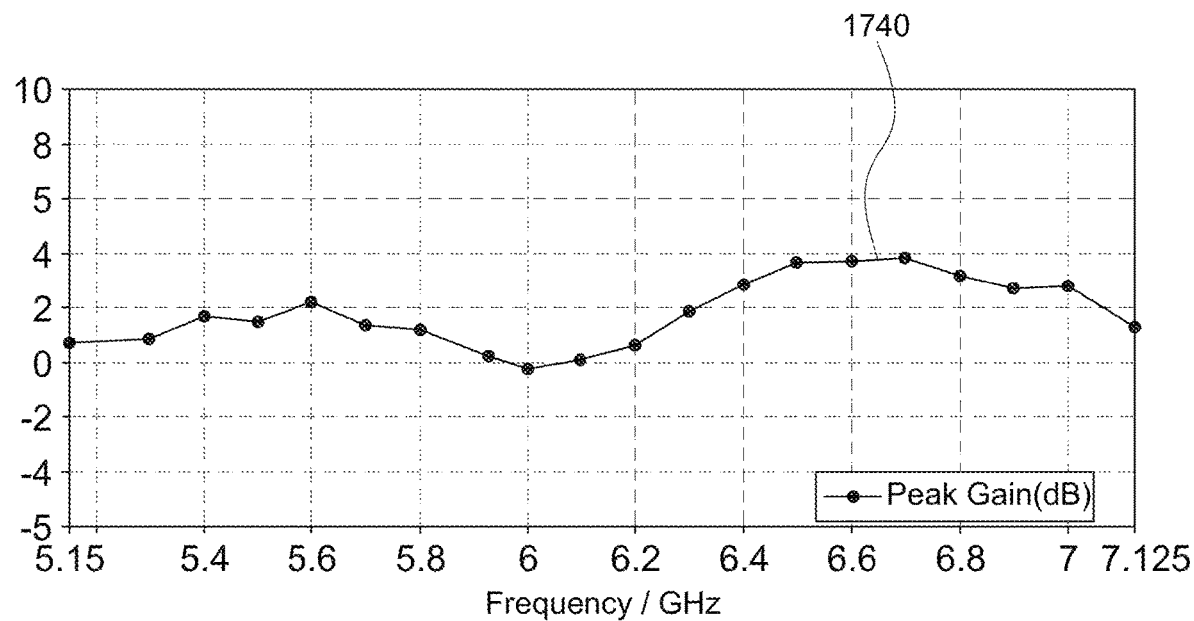

FIG. 17*e* shows a simulation of an antenna peak gain in dB as a function of the frequency for 5.1-7.1 GHz. The slot antenna peak gain may be below 4 dB. Thus, the proposed slot antenna may be used in an electronic device for WLAN-6E radiation.

Figure 17G:
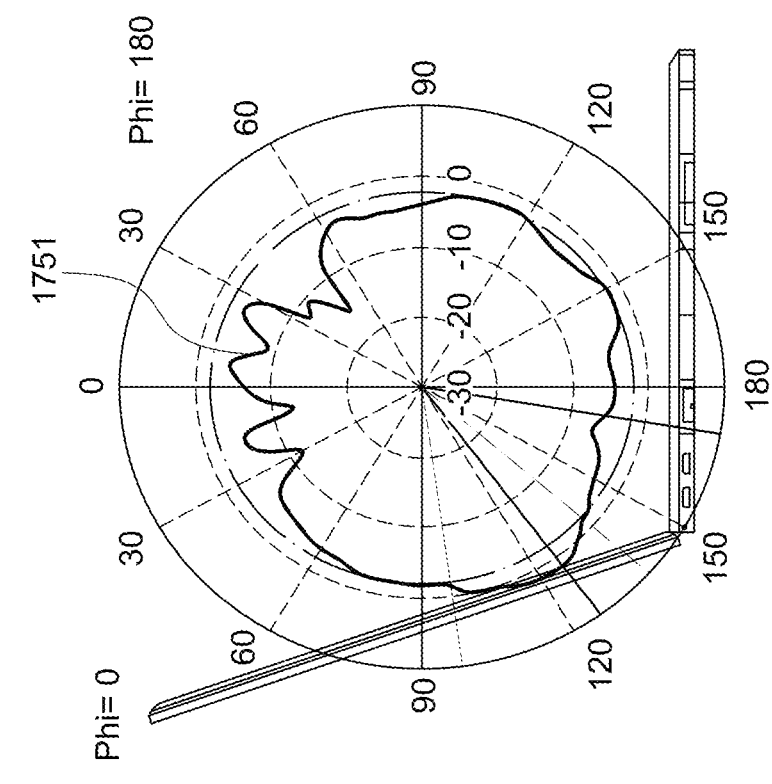
Figure 17F:
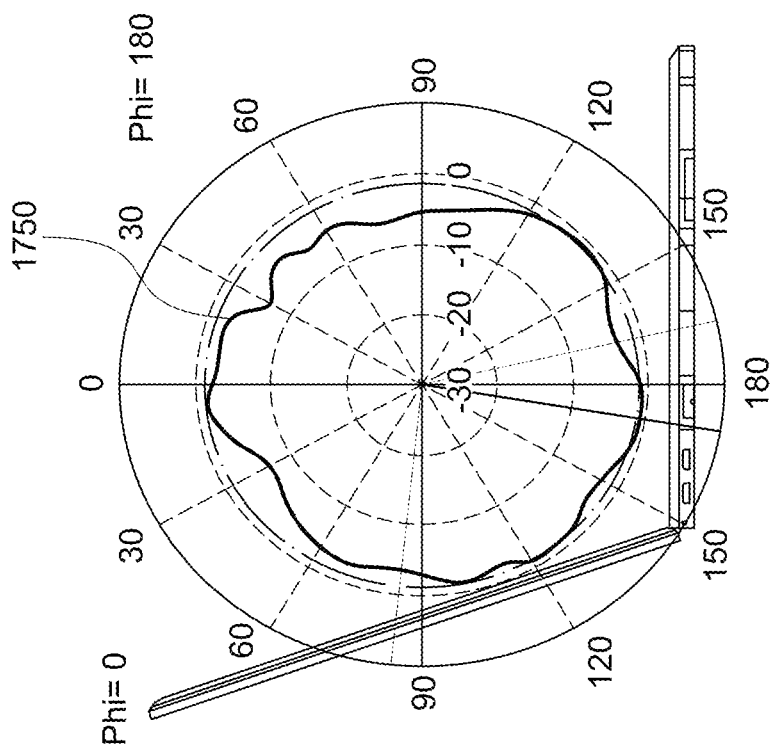
Figure 17H:
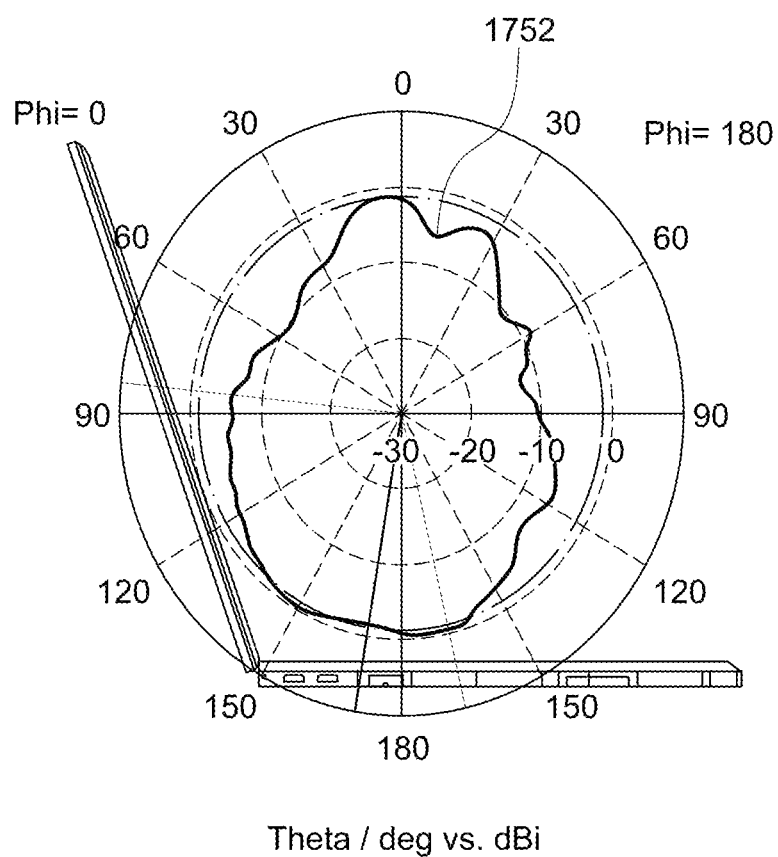

FIGS. 17*f*, 17*g*, and 17*h* show a radiation pattern for $\phi=0°$ at 2.45 GHz 1751, 5.5 GHz 1752 and 6.5 GHz 1753, respectively. For example, for $\phi=0°$ a radiation pattern in a plane rectangular to a surface on which the electronic device may be placed may be simulated. For example, for $\phi=0°$ a radiation pattern in a plane parallel to the slot antenna may be simulated. The radiation patterns 1751, 1572, 1753 show an omni-directional radiation pattern. A significant decrease can not be seen for any radiation direction. Thus, the proposed slot antenna may be used in an electronic device for WLAN-6E radiation.

Figure 17J:
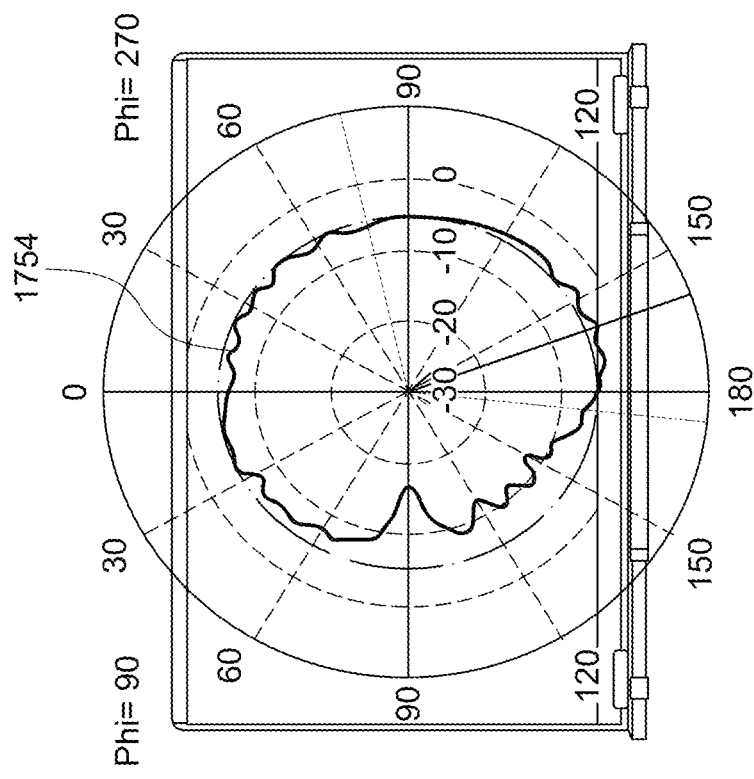
Figure 17I:
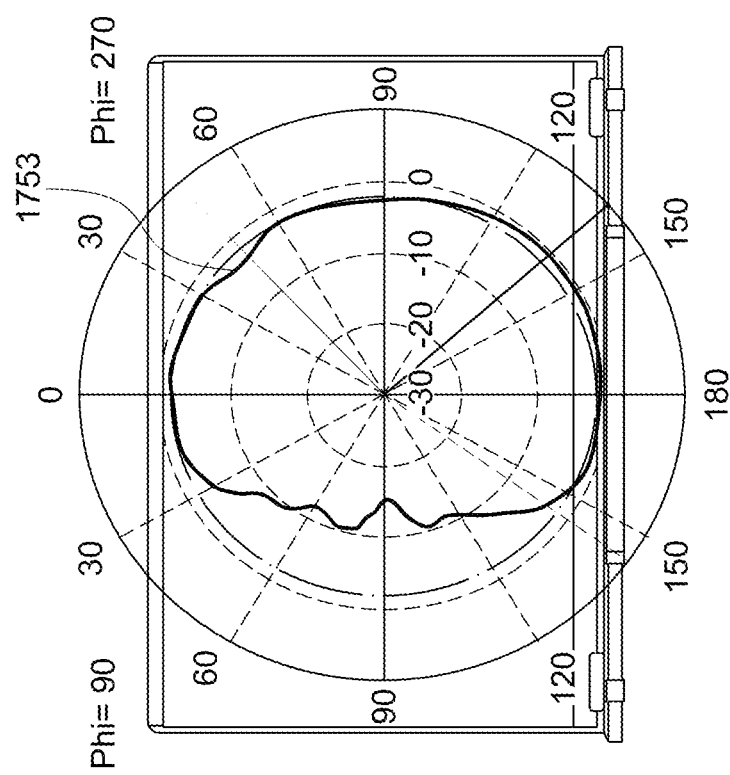
Figure 17K:
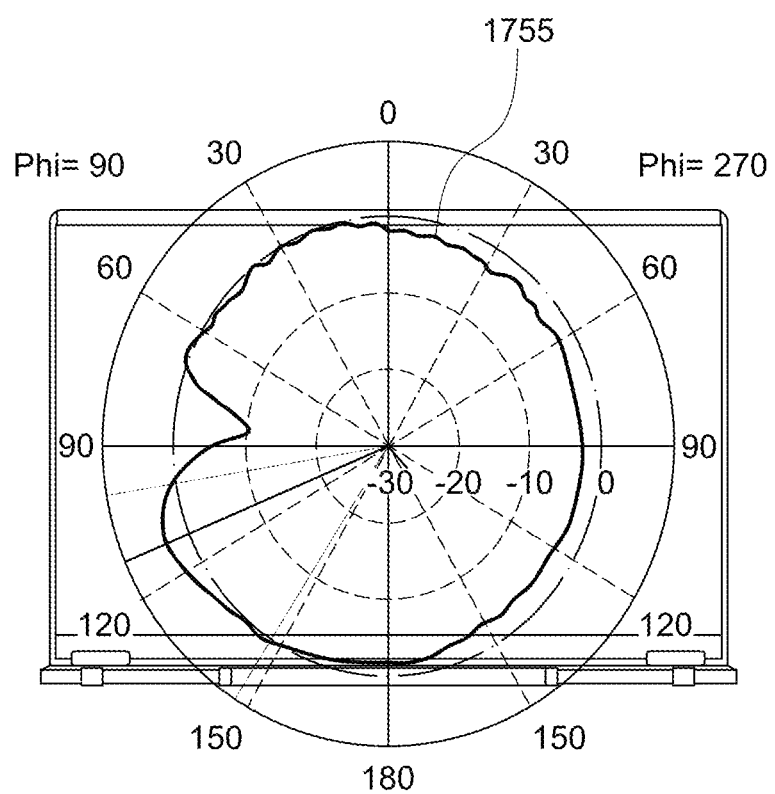

FIGS. 17*i*, 17*j*, and 17*k* show a radiation pattern for $\phi=90°$ at 2.45 GHz 1754, 5.5 GHz 1755 and 6.5 GHz 1756, respectively. For example, for $\phi=90°$ a radiation pattern in a plane rectangular to a surface on which the electronic device may be placed may be simulated. For example, for $\phi=90°$ a radiation pattern in a plane rectangular to the slot antenna may be simulated. The radiation patterns 1753, 1574, 1755 show an omni-directional radiation pattern. A significant decrease can not be seen for any radiation direction. Thus, the proposed slot antenna may be used in an electronic device for WLAN-6E radiation.

Figure 17M:
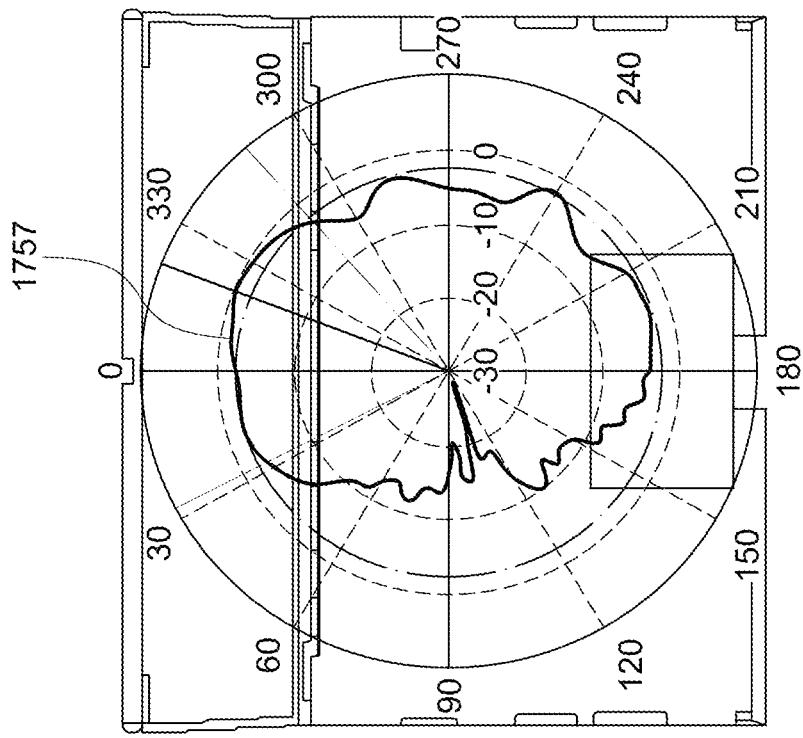
Figure 17L:
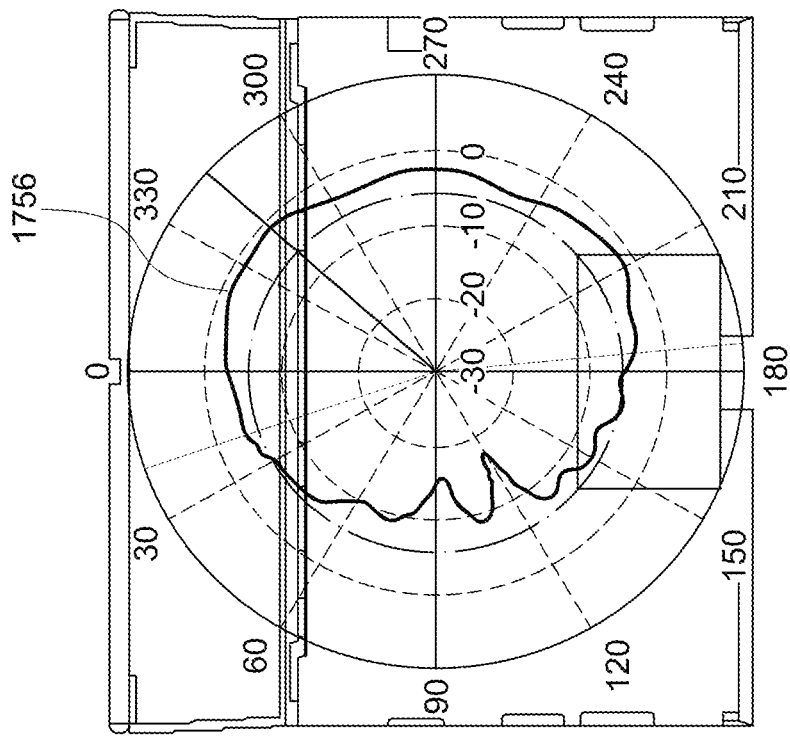
Figure 17N:
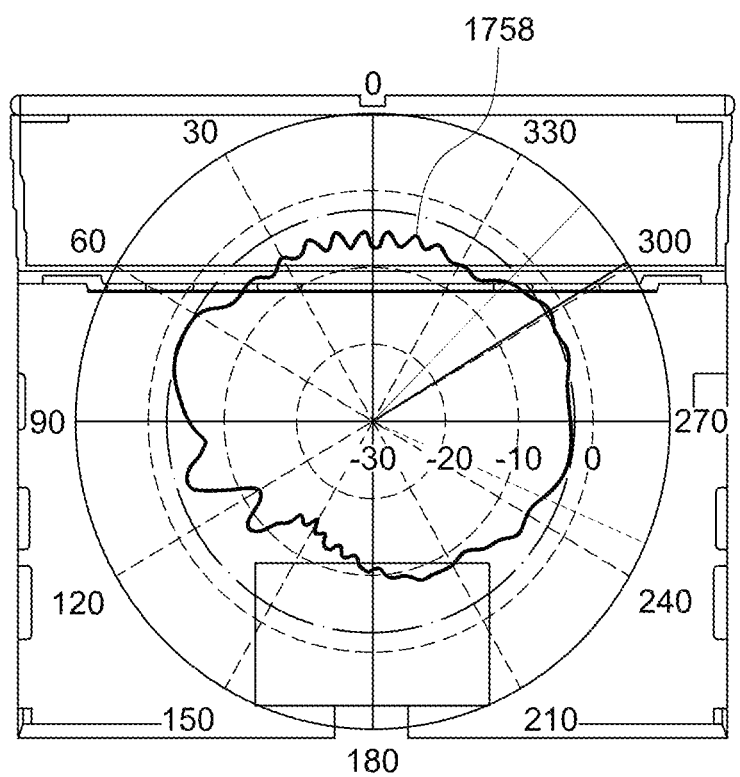

FIGS. 17*l*, 17*m*, and 17*n* show a radiation pattern for $\vartheta=90°$ at 2.45 GHz 1754, 5.5 GHz 1755 and 6.5 GHz 1756, respectively. For example, for $\vartheta=90°$ a radiation pattern in a plane parallel to a surface on which the electronic device may be placed may be simulated. The radiation patterns 1756, 1577, 1758 may show an omni-directional radiation pattern. A significant decrease can not be seen for any radiation direction. Thus, the proposed slot antenna may be used in an electronic device for WLAN-6E radiation.

More details and aspects are mentioned in connection with the examples described above and/or below. The example shown in FIG. 17 may comprise one or more optional additional features corresponding to one or more aspects mentioned in connection with the proposed concept or one or more examples described above (e.g., FIG. 1-17) and/or below (e.g., FIG. 18-20).

Figure 18:
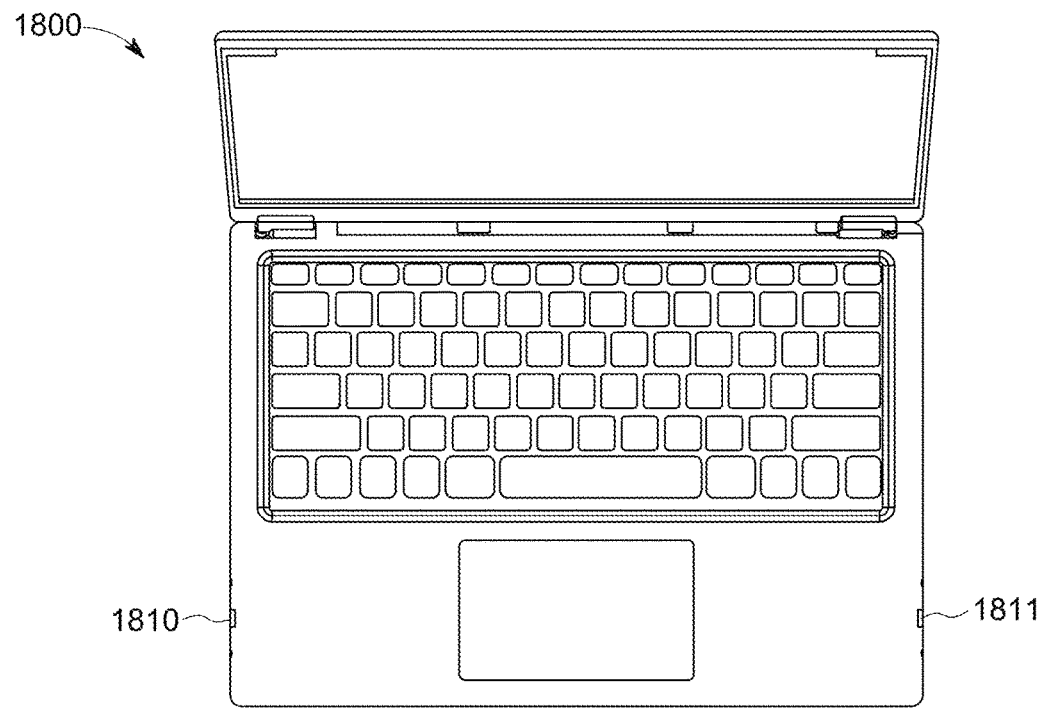
FIG. 18 shows an example of an electronic device with two antennas.

FIG. 18 shows an example of an electronic device with two antennas. The two antenna 1810, 1811 may be arranged on opposite sides of a chassis of the electronic device 1800. The antenna 1810, 1811 may by shielded by a radiation shielding each.

More details and aspects are mentioned in connection with the examples described above and/or below. The example shown in FIG. 18 may comprise one or more optional additional features corresponding to one or more aspects mentioned in connection with the proposed concept or one or more examples described above (e.g., FIG. 1-17) and/or below (e.g., FIG. 18-20).

Figure 19:
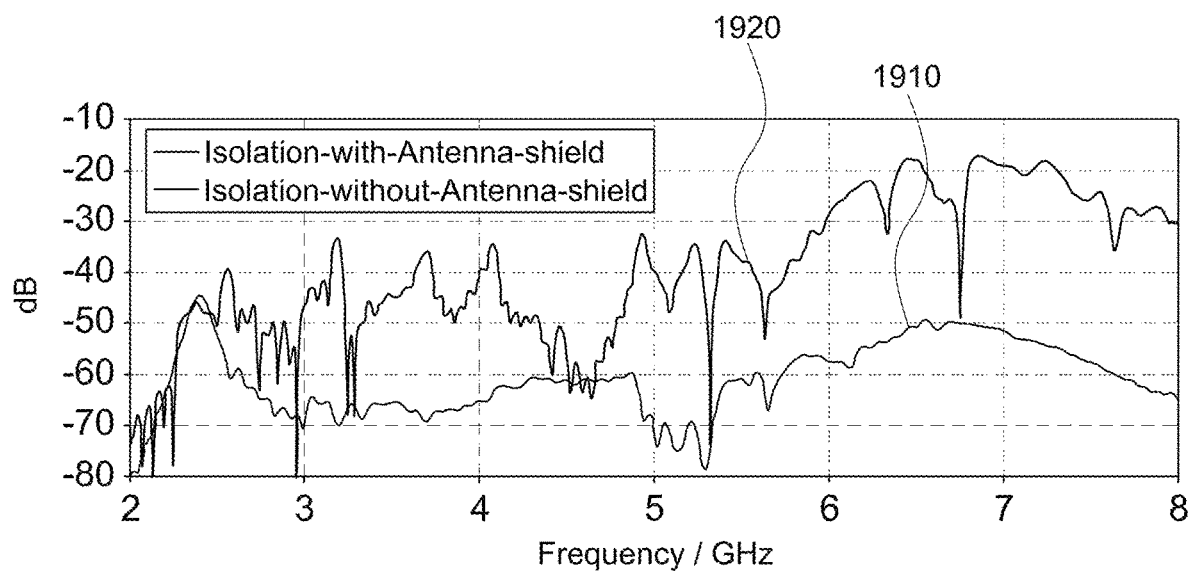
FIG. 19 shows a simulation of the electronic device with two antennas from FIG. 18.

FIG. 19 shows a simulation of the electronic device with two antennas from FIG. 18. Two WLAN antennas may be required to support 2×2 multiple-in multiple-out (MIMO). Thus, an antenna-to-antenna isolation may be important for a better throughput. An antenna-to-antenna isolation may be improved by the proposed radiation shielding above. For the simulations shown in FIG. 19 two antenna are arranged on opposing sides of the chassis. A radiation shielding is arranged in a distance of 320 mm to each antenna.

FIG. 19 shows a simulation of a magnitude of a S12-parameter in dB as a function of the frequency with 1910 and without 1920 two radiation shieldings. For the usage of the two radiation shieldings a magnitude of the S12-parameter may be decreased. Especially in a higher frequency band (e.g., 5.15 GHz-7.125 GHz) the magnitude may be decreased by roughly 30 dB. Thus, two radiation shieldings may increase a performance of the two antennas. For example, an antenna to antenna may be improved by the two radiation shieldings.

More details and aspects are mentioned in connection with the examples described above and/or below. The example shown in FIG. 19 may comprise one or more optional additional features corresponding to one or more aspects mentioned in connection with the proposed concept or one or more examples described above (e.g., FIG. 1-18) and/or below (e.g., FIG. 19-20).

FIG. 20 shows simulations of an example of a slot antenna for an electronic device for different modes. The simulation is performed for a G-shaped slot antenna with a width of 12.2 mm and a height of 3.3 mm. Further, the simulation is performed with a radiation shielding and a full metal laptop base. For the simulation, the slot antenna is proximity coupled with a metal trace. The trace is formed on a FPC which is glued to an inner side of the chassis, e.g., of the z-edge, behind the slot antenna. The metal trace is coupled to the slot structure and a gap between them provides impedance matching and coupling strength between them. A slot in a D-cover has a width of 26 mm and a length of 3.5 mm and may provide a wider impedance bandwidth.

The antenna performance is validated for different operation modes as open lid-mode, close lid-mode and tablet-mode. An antenna designed only for open lid-mode may have a strong performance drop in close lid-mode and/or tablet-mode, because of shielding caused by a (metal) lid and/or display frame. An air gap between a display and a C-cover may be at most 0.6 mm in close lid-mode, whereas an air gap between lid and D-cover may be at most 2 mm in tablet-mode. Thus, the lid and/or the frame of the display may decrease an antenna performance. By arranging the antenna on a lateral part of the chassis the antenna performance may be improved. For example, the by arranging the antenna on a lateral part of the chassis an antenna performance may be less impacted by an operation mode.

Figure 20A:
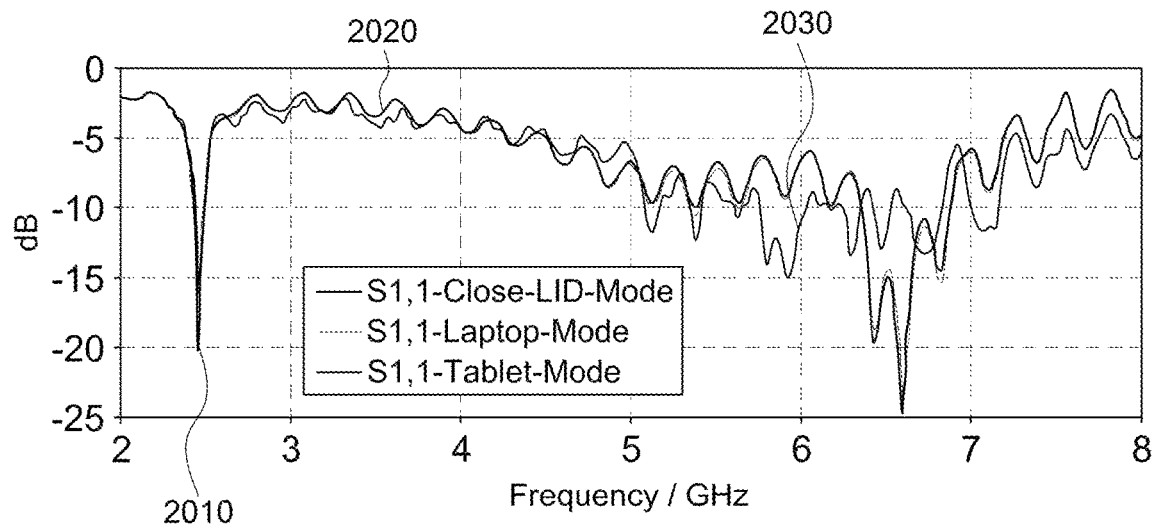
FIGS. 20*a* to 20*e* show simulations of an example of a slot antenna for an electronic device for different modes.

FIG. 20a shows a simulation of a S11-parameter in dB as a function of the frequency for closed lid-mode 2010, open lid-mode 2020 (laptop-mode) and tablet-mode 2030 of the electronic device. The return-loss (S11-parameter in dB) may be for the frequency bands from 2 GHZ-5.5 GHz and 7 GHz-8 GHz roughly identical for all three operation modes. Further, the return-loss may be for open lid-mode 2020 and close lid-mode over the whole frequency band from 2 GHz-8 GHz nearly identical. Thus, the proposed antenna may be used in an electronic device for all operation modes.

Figure 20B:
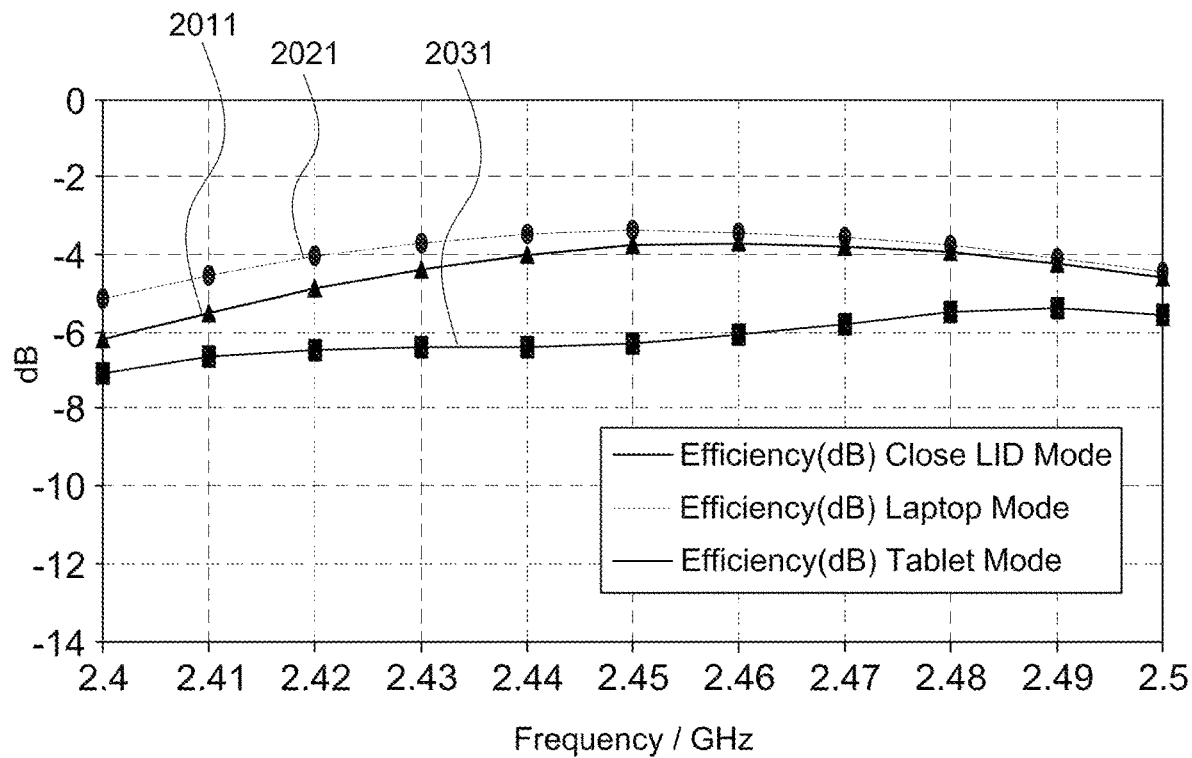

FIG. 20b shows a simulation of a slot antenna radiation efficiency in dB as a function of the frequency for 2.4-2.5 GHz. The antenna radiation efficiency may be below −3 dB for all three operation modes, namely for close lid-mode 2011, open lid-mode 2021 and tablet-mode. Thus, the proposed slot antenna may be used in an electronic device for WLAN-6E radiation.

Figure 20C:
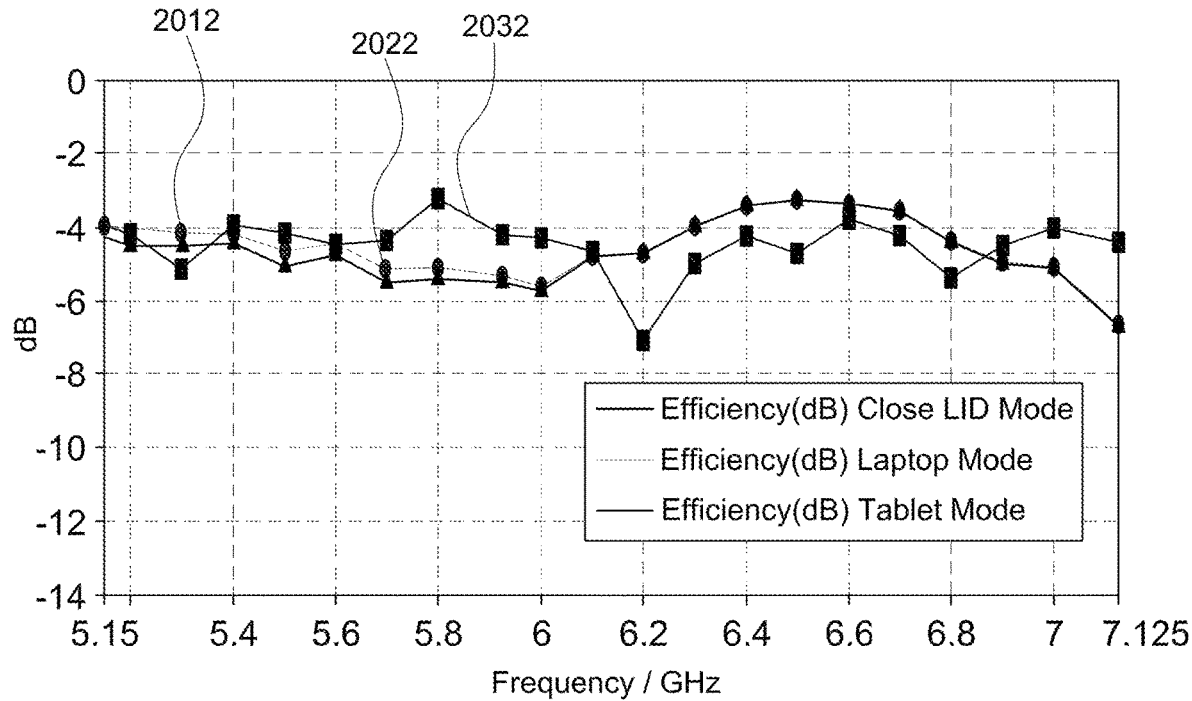

FIG. 20c shows a simulation of a slot antenna radiation efficiency in dB as a function of the frequency for 5.1-7.1 GHz. The antenna radiation efficiency may be below −3 dB for all three operation modes, namely for close lid-mode 2012, open lid-mode 2022 and tablet-mod 2032. Thus, the proposed slot antenna may be used in an electronic device for WLAN-6E radiation.

Figure 20D:
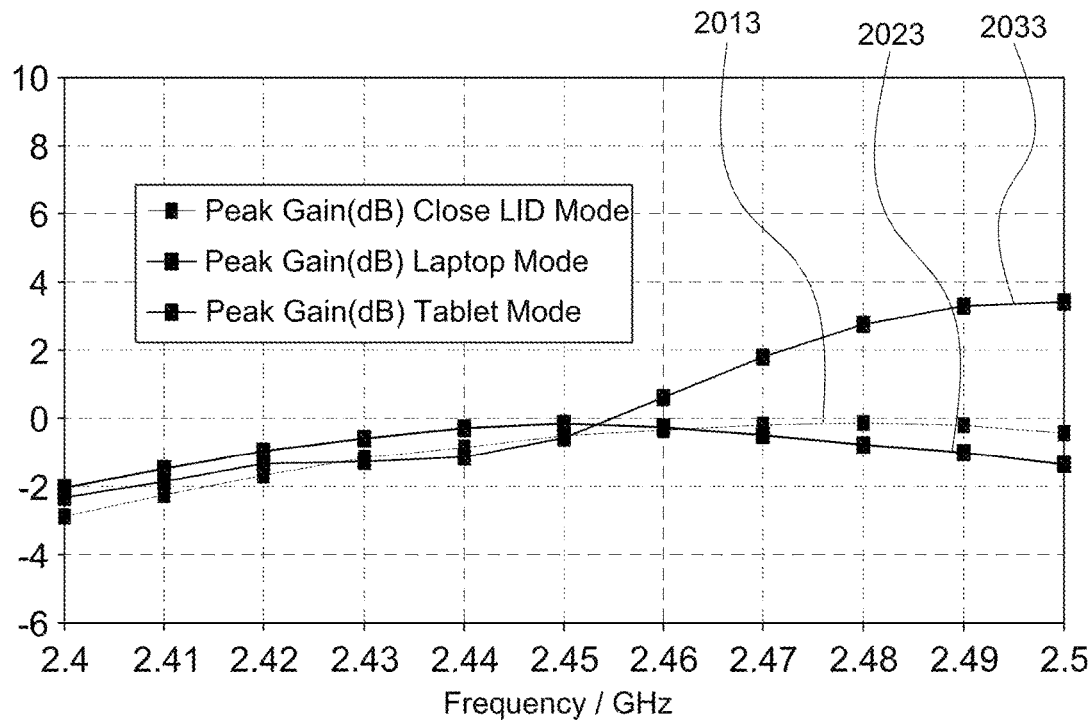

FIG. 20d shows a simulation of an antenna peak gain in dB as a function of the frequency for 2.4-2.5 GHz. The slot antenna peak gain may be below 4 dB for all three operation modes, namely for close lid-mode 2013, open lid-mode 2023 and tablet-mode 2033. Thus, the proposed slot antenna may be used in an electronic device for WLAN-6E radiation.

Figure 20E:
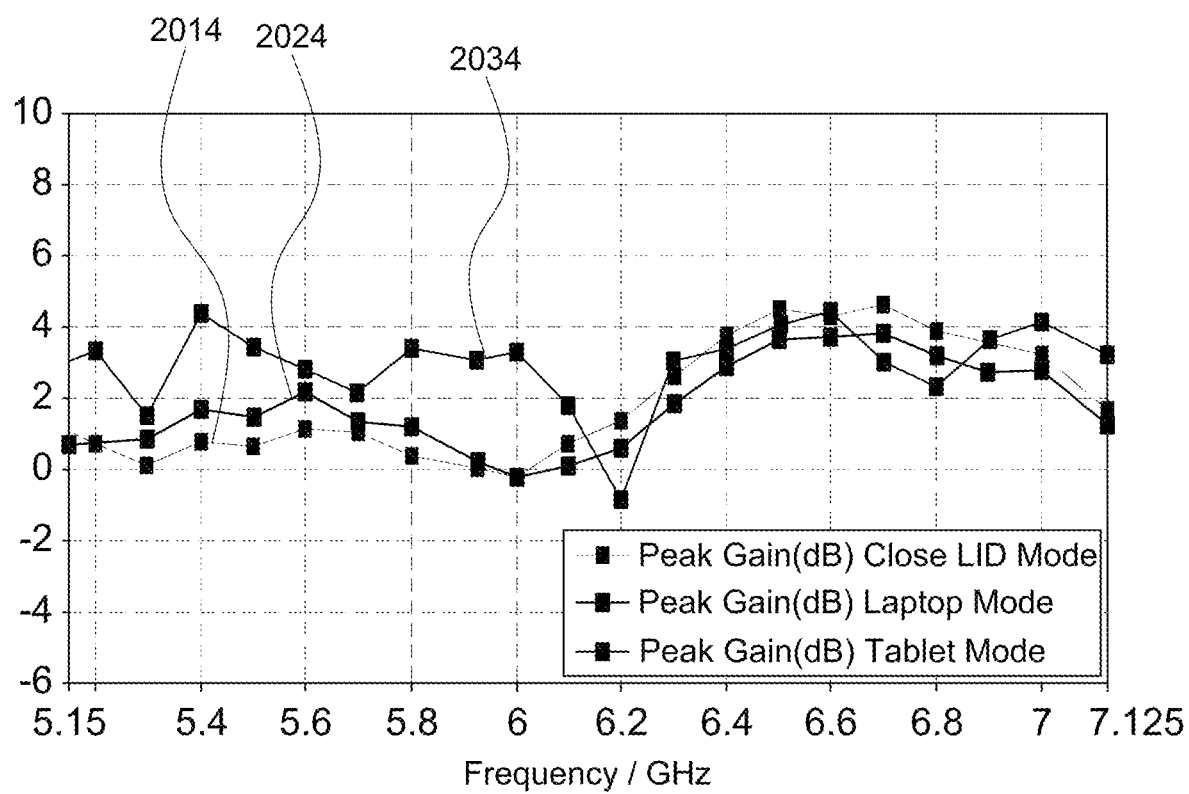

FIG. 20e shows a simulation of an antenna peak gain in dB as a function of the frequency for 5.1-7.1 GHz. The slot antenna peak gain may be below 5 dB for all three operation modes, namely for close lid-mode 2013, open lid-mode 2023 and tablet-mode 2033. Thus, the proposed slot antenna may be used in an electronic device for WLAN-6E radiation.

More details and aspects are mentioned in connection with the examples described above. The example shown in FIG. 20 may comprise one or more optional additional features corresponding to one or more aspects mentioned in connection with the proposed concept or one or more examples described above (e.g., FIG. 1-19).

The slot antenna proposed above may be suitable designed for WIFI-6E and placement in a base of a laptop. The chassis design may have a minimum plastic/non-conductive material in a metal chassis which can even be not visible. Hence, the system may have seamless metal chassis look.

The proposed radiation shielding arranged in a lateral part may omit a plate over noise sources (e.g., CPU, DDR) in a motherboard.

The slot antenna may used as antenna module. An electronic device may have an increased space for heat spread structure, because a plastic area may be reduced. The slot antenna and the radiation shielding may be integrated in the chassis, thus an assembly time may be reduced.

Figure 21:
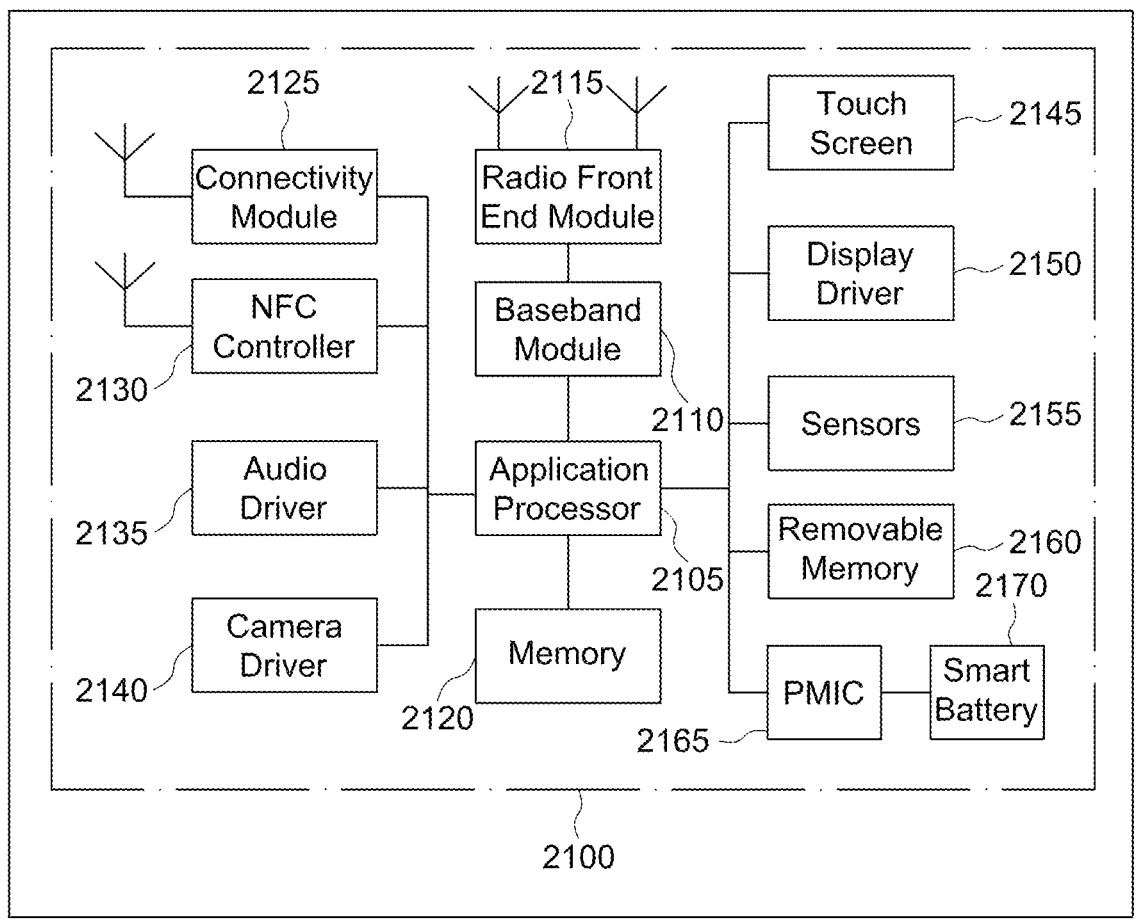
FIG. 21 illustrates a user device 2100 in accordance with an aspect.

FIG. 21 illustrates a user device 2100 in accordance with an aspect. The user device 2100 may be a mobile device in some aspects and includes an application processor 2105, baseband processor 2110 (also referred to as a baseband module), radio front end module (RFEM) 2115, memory 2120, connectivity module 2125, near field communication (NFC) controller 2130, audio driver 2135, camera driver 2140, touch screen 2145, display driver 2150, sensors 2155, removable memory 2160, power management integrated circuit (PMIC) 2165 and smart battery 2170. A radiation shielding may be arranged in the user device 2100, e.g., to shield a slot antenna against an electromagnetic signal of the application processor 2105.

In some aspects, application processor 2105 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 2110 may be implemented, for example, as a solder-down substrate including one or more integrated circuits, a single packaged integrated circuit soldered to a main circuit board, and/or a multi-chip module containing two or more integrated circuits.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The examples described herein may be summarized as follows:

Example 1 is a chassis for an electronic device, wherein the chassis comprises a chassis part made of conducting material, and at least one slot antenna is formed in the chassis part made of conducting material.

Example 2 is the chassis of example 1, wherein the at least one slot antenna is formed on a lateral part of the chassis.

Example 3 is the chassis according to any one of the preceding examples, wherein the at least one slot antenna is formed by an opening in the chassis part made of conducting material.

Example 4 is the chassis according to example 3, wherein the opening is filled with non-conducting material.

Example 5 is the chassis according to example 4, wherein the non-conducting material to fill the opening has a base, wherein the base is configured to improve an arrangement of the non-conducting material, and wherein the base is arranged in a second opening in the chassis.

Example 6 is the chassis according to any one of the preceding examples, wherein the chassis is entirely made of conducting material.

Example 7 is the chassis according to any one of the preceding examples, further comprising a radiation shielding configured to electromagnetically shield the slot antenna from an interior of the chassis.

Example 8 is the chassis according to example 7, further comprising at least one conducting gasket arranged between the radiation shielding and another part of the chassis.

Example 9 is the chassis according to any one of examples 7-8, further comprising two conducting gaskets arranged between the radiation shielding and a respective other part of the chassis, wherein the two conducting gaskets are arranged at opposite sides of the radiation shielding.

Example 10 is the chassis according to any one of the preceding examples, further comprising a second slot antenna formed in the chassis part made of conducting material or formed in an opposing chassis part made of conducting material, wherein the second slot antenna is arranged at a lateral part of the chassis opposite to the at least one slot antenna.

Example 11 is the chassis according to any one of the preceding examples, wherein the chassis comprises a first chassis part and a second chassis part connected to each other, the first chassis part is adapted for placing the chassis on a surface such that the first chassis part is arranged between the surface and the second chassis part, and the at least one slot antenna is formed in the second chassis part.

Example 12 is an electronic device, comprising: a chassis according to any of examples 1 to 11; and an antenna feed configured to excite the at least one slot antenna based on a feed signal.

Example 13 is the electronic device of example 12, wherein the antenna feed comprises an exciter, which is proximity coupled to the at least one slot antenna.

Example 14 is the electronic device according to any one of examples 12-13, wherein the antenna feed is formed on a printed circuit board or on a flexible printed circuit board.

Example 15 is the electronic device according to any one of examples 12-14, wherein the antenna feed comprises a feed line; and the feed line forms a short circuit or an open circuit.

Example 16 is the electronic device according to any one of examples 12-15, wherein the antenna feed comprises an impedance matching circuit.

Example 17 is the electronic device according to any one of examples 12-16, wherein the antenna feed comprises a feed line passing through an opening in a radiation shielding of the electronic device that electrically shields the slot antenna from an interior of the chassis, and the feed line is enclosed by a sleeve of conducting material that covers the opening in the radiation shielding.

Example 18 is the electronic device according to any one of examples 12-17, further comprising a conductive element attached to the antenna feed for grounding the antenna feed.

Example 19 is the electronic device according to any one of examples 12-18, wherein the antenna feed comprises at least one recess for facilitating bending of the antenna feed.

Example 20 is the electronic device according to any one of examples 12-19, wherein the antenna feed comprises at least one recess configured to receive an attaching element for attaching the antenna feed to the chassis.

Example 21 is the electronic device according to any one of examples 12-20, wherein the slot antenna comprises at least two slots adapted for transmitting and receiving at two different wavelengths.

Example 22 is the electronic device according to example any one of examples 12-21, wherein the antenna feed is arranged to excite the at least two slots at the same time.

Example 23 is the electronic device of any of examples 12-22, wherein the electronic device is a mobile device.

Example 24 is a method for fabricating an electronic device, comprising: forming an opening in a conducting part of a chassis of the electronic device to form a slot antenna; and filling the opening with non-conducting material.

Example 25 is the method according to example 24, further comprising: arranging an antenna feed within the chassis such that the antenna feed and the slot antenna are proximity coupled.

Example 26 is the method according to example 25, further comprising: arranging a radiation shielding within the chassis such that the radiation shielding at least partially encloses the slot antenna and the antenna feed within the chassis in order to shield the slot antenna and the antenna feed from electromagnetic radiation emitted by other circuitry of the electronic device.

Example 27 is an antenna module for a portable electronic device, comprising: a chassis, comprising a chassis part made of conducting material and a chassis part made of non-conducting material, and wherein a slot antenna is formed in the chassis part made of conducting material; and an antenna feed arranged within the chassis and configured to excite the slot antenna based on a feed signal.

Example 28 is the antenna module according to example 27, wherein all sides of the chassis are made of conducting material except one side comprising the chassis part made of a non-conducting material.

Example 29 is the antenna module according to any one of examples 27-28, wherein the antenna module comprises an opening for a feed line coupled to the antenna feed.

Example 30 is the antenna module according to example 29, wherein the feed line is enclosed by a sleeve of conducting material that covers the opening in a radiation shielding.

Example 31 is a mobile device comprising the antenna module according to any one of examples 27-30.

Example 32 is an electronic device comprising: antenna arranged in a lateral part of a chassis of the electronic device; electronic circuitry; and a radiation shielding arranged in the lateral part of the chassis and between the antenna and the electronic circuitry, wherein the radiation shielding is configured to shield the antenna from electromagnetic radiation emitted by the electronic circuitry.

Example 33 is the electronic device according to example 32, further comprising: at least one conducting gasket arranged between the radiation shielding and a part of the chassis.

Example 34 is the electronic device according to any one of the examples 32-33, further comprising: two conducting gaskets arranged between the radiation shielding and a respective part of the chassis, wherein the two conducting gaskets are arranged at opposite sides of the radiation shielding.

Example 35 is the electronic device according to any one of the examples 32-34, wherein the radiation shielding is made of conducting material.

Example 36 is the electronic device according to any one of the examples 32-35, wherein the radiation shielding is detachable from the electronic device.

Example 37 is the electronic device according to any one of the examples 32-36, further comprising: a feeding element, wherein the feeding element is arranged within a space formed by the radiation shielding around the antenna, wherein the feeding element is proximity coupled to the antenna.

Example 38 is the electronic device according to example 37, further comprising: a feed line coupled to the feeding element and passing through an opening in the radiation shielding, wherein the feed line is enclosed by a sleeve of conducting material that covers the opening in the radiation shielding.

Example 39 is the electronic device according to any one of the examples 32-38, wherein the radiation shielding has a U-shape.

Example 40 is an antenna feed for exciting an antenna, comprising a first feed line; a second feed line; and a third feed line, wherein the third feed line connects the first feed line with the second feed line and the second feed line is longer as the first feed line.

Example 41 is the antenna feed according to example 40, further comprising a cable connected to the first feed line for receiving a feed signal.

Example 42 is the antenna feed according to any one of the examples 40-41, further comprising at least one impedance matching circuit arranged at an end region of the first feed line or the second feed line.

The following examples are hereby incorporated in the detailed description, wherein each example may stand on its own as a separate example. It should also be noted that although in the examples a dependent example refers to a particular combination with one or more other examples, other examples may also include a combination of the dependent example with the subject matter of any other dependent or independent example. Such combinations are hereby explicitly proposed, unless it is stated in the individual case that a particular combination is not intended. Furthermore, features of an example should also be included for any other independent example, even if that example is not directly defined as dependent on that other independent example.

What is claimed is:

1. A chassis for an electronic device, wherein the chassis comprises a chassis part made of a conducting material, and at least one slot antenna is formed in the chassis part made of the conducting material,
    wherein the at least one slot antenna is formed by an opening in the chassis part made of the conducting material;
    wherein the opening is filled with a non-conducting material;
    wherein the non-conducting material to fill the opening has a base; and
    wherein the base is configured to improve an arrangement of the non-conducting material and wherein the base is arranged in a second opening in the chassis.

2. The chassis of claim 1, wherein the at least one slot antenna is formed on a lateral part of the chassis.

3. The chassis according to claim 1, wherein the second opening in the chassis is configured to improve a radiation performance of the at least one slot antenna.

4. The chassis according to claim 1, wherein the chassis is entirely made of conducting material.

5. The chassis according to claim 1, further comprising a radiation shielding configured to electromagnetically shield the slot antenna from an interior of the chassis.

6. The chassis according to claim 5, further comprising at least one conducting gasket arranged between the radiation shielding and another part of the chassis.

7. The chassis according to claim 5, further comprising two conducting gaskets arranged between the radiation shielding and a respective other part of the chassis, wherein the two conducting gaskets are arranged at opposite sides of the radiation shielding.

8. The chassis according to claim 1, further comprising a second slot antenna formed in the chassis part made of conducting material or formed in another chassis part made of conducting material, wherein the second slot antenna is arranged at a lateral part of the chassis opposite to the at least one slot antenna.

9. The chassis according to claim 1, wherein
the chassis comprises a first chassis part and a second chassis part connected to each other,
the first chassis part is adapted for placing the chassis on a surface such that the first chassis part is arranged between the surface and the second chassis part, and
the at least one slot antenna is formed in the second chassis part.

10. An electronic device, comprising:
a chassis according to claim 1; and
an antenna feed configured to excite the at least one slot antenna based on a feed signal.

11. The electronic device of claim 10, wherein the antenna feed comprises an exciter, which is proximity coupled to the at least one slot antenna.

12. The electronic device according to claim 10, wherein the antenna feed is formed on a printed circuit board or on a flexible printed circuit board.

13. The electronic device according to claim 10, wherein
the antenna feed comprises a feed line, and
the feed line forms a short circuit or an open circuit.

14. An antenna module for a portable electronic device, comprising:
a chassis, comprising a chassis part made of a conducting material and a chassis part made of a non-conducting material,
wherein a slot antenna is formed by an opening in the chassis part made of the conducting material,
wherein the opening is filled with the non-conducting material,
wherein the non-conducting material to fill the opening has a base, and
wherein the base is arranged to form the chassis part made of the non-conducting material; and
an antenna feed arranged within the chassis and configured to excite the slot antenna based on a feed signal.

15. The antenna module according to claim 14, wherein all sides of the chassis are made of conducting material except one side comprising the chassis part made of a non-conducting material.

16. An electronic device, comprising:
an antenna arranged in a lateral part of a chassis of the electronic device,
wherein the antenna is formed by an opening in a chassis part made of a conducting material,
wherein the opening is filled with a non-conducting material,
wherein the non-conducting material to fill the opening has a base, and
wherein the base is configured to improve an arrangement of the non-conducting material and wherein the base is arranged in a second opening in the chassis;
an electronic circuitry; and
a radiation shielding arranged in the lateral part of the chassis and between the antenna and the electronic circuitry, wherein the radiation shielding is configured to shield the antenna from electromagnetic radiation emitted by the electronic circuitry.

17. The electronic device according to claim 16, further comprising at least one conducting gasket arranged between the radiation shielding and a part of the chassis.

18. The electronic device according to claim 16, further comprising a feeding element, wherein the feeding element is arranged within a space formed by the radiation shielding around the antenna, wherein the feeding element is proximity coupled to the antenna.

* * * * *